United States Patent
Shoji

(10) Patent No.: US 10,886,456 B2
(45) Date of Patent: *Jan. 5, 2021

(54) NONVOLATILE MAGNETIC MEMORY DEVICE

(71) Applicant: SONY CORPORATION, Tokyo (JP)

(72) Inventor: Mitsuharu Shoji, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 10 days.

This patent is subject to a terminal disclaimer.

(21) Appl. No.: 16/156,397

(22) Filed: Oct. 10, 2018

(65) Prior Publication Data

US 2019/0051817 A1 Feb. 14, 2019

Related U.S. Application Data

(63) Continuation of application No. 15/338,783, filed on Oct. 31, 2016, now Pat. No. 10,128,432, which is a
(Continued)

(30) Foreign Application Priority Data

Jan. 14, 2009 (JP) .................. 2009-005876

(51) Int. Cl.
  *H01L 43/02* (2006.01)
  *B82Y 25/00* (2011.01)
  (Continued)

(52) U.S. Cl.
  CPC .............. *H01L 43/02* (2013.01); *B82Y 25/00* (2013.01); *G11C 11/16* (2013.01); *G11C 11/161* (2013.01);
  (Continued)

(58) Field of Classification Search
  None
  See application file for complete search history.

(56) References Cited

U.S. PATENT DOCUMENTS

| 5,901,018 A | 5/1999 | Fontana et al. |
| 6,359,760 B2 | 3/2002 | Kanno |

(Continued)

FOREIGN PATENT DOCUMENTS

| JP | 2003-017782 A | 1/2003 |
| JP | 2006-156608 A | 6/2006 |

(Continued)

OTHER PUBLICATIONS

Notice of Allowance and Fees Due for U.S. Appl. No. 15/338,783, dated Jul. 16, 2018, 07 pages.

(Continued)

*Primary Examiner* — Thien F Tran
(74) *Attorney, Agent, or Firm* — Chip Law Group

(57) ABSTRACT

A nonvolatile magnetic memory device having a magnetoresistance-effect element includes: (A) a laminated structure having a recording layer in which an axis of easy magnetization is oriented in a perpendicular direction; (B) a first wiring line electrically connected to a lower part of the laminated structure; and (C) a second wiring line electrically connected to an upper part of the laminated structure, wherein a high Young's modulus region having a Young's modulus of a higher value than that of a Young's modulus of a material forming the recording layer is provided close to a side surface of the laminated structure.

13 Claims, 13 Drawing Sheets

Related U.S. Application Data continuation of application No. 14/158,326, filed on Jan. 17, 2014, now Pat. No. 9,508,919, which is a continuation of application No. 12/683,115, filed on Jan. 6, 2010, now Pat. No. 8,659,102.

(51) Int. Cl.
| | | |
|---|---|---|
| *H01F 10/32* | (2006.01) | |
| *G11C 11/16* | (2006.01) | |
| *H01L 27/22* | (2006.01) | |
| *H01L 43/08* | (2006.01) | |
| *H01L 43/10* | (2006.01) | |

(52) U.S. Cl.
CPC ....... *H01F 10/3286* (2013.01); *H01L 27/228* (2013.01); *H01L 43/08* (2013.01); *H01L 43/10* (2013.01); *H01F 10/3254* (2013.01); *H01F 10/3263* (2013.01)

(56) References Cited

U.S. PATENT DOCUMENTS

| | | | |
|---|---|---|---|
| 6,992,359 | B2 | 1/2006 | Nguyen et al. |
| 7,363,699 | B2 | 4/2008 | Carey et al. |
| 7,933,145 | B2 | 4/2011 | Yamagishi et al. |
| 8,659,102 | B2 | 2/2014 | Shoji |
| 9,508,919 | B2 | 11/2016 | Shoji |
| 10,128,432 | B2 * | 11/2018 | Shoji ................... B82Y 25/00 |
| 2005/0018365 | A1 | 1/2005 | Gill |
| 2005/0106810 | A1 | 5/2005 | Pakala et al. |
| 2005/0180061 | A1 | 8/2005 | Ding et al. |
| 2006/0008623 | A1 | 1/2006 | Nagawa et al. |
| 2006/0087771 | A1 | 4/2006 | Gill |
| 2006/0118842 | A1 | 6/2006 | Iwata |
| 2006/0251928 | A1 | 11/2006 | Quandt et al. |
| 2008/0164502 | A1 | 7/2008 | Fukumoto et al. |
| 2013/0037862 | A1 * | 2/2013 | Kitagawa ............... H01L 43/08 257/252 |

FOREIGN PATENT DOCUMENTS

| | | |
|---|---|---|
| JP | 2007-513501 A | 5/2007 |
| JP | 2007-194426 A | 8/2007 |
| JP | 2007-525847 A | 9/2007 |
| WO | 2007/019002 A2 | 2/2007 |

OTHER PUBLICATIONS

Non-Final Rejection for U.S. Appl. No. 15/338,783, dated Jan. 24, 2018, 09 pages.
Advisory Action for U.S. Appl. No. 15/338,783, dated Dec. 4, 2017, 03 pages.
Final Rejection for U.S. Appl. No. 15/338,783, dated Sep. 21, 2017, 09 pages.
Non-Final Rejection for U.S. Appl. No. 15/338,783, dated Apr. 19, 2017, 08 pages.
Notice of Allowance and Fees Due for U.S. Appl. No. 14/158,326, dated Jul. 21, 2016, 07 pages.
Non-Final Rejection for U.S. Appl. No. 14/158,326, dated Apr. 7, 2016, 10 pages.
Advisory Action for U.S. Appl. No. 14/158,326, dated Mar. 2, 2016, 03 pages.
Final Rejection for U.S. Appl. No. 14/158,326, dated Dec. 23, 2015, 09 pages.
Non-Final Rejection for U.S. Appl. No. 14/158,326, dated Feb. 24, 2015, 06 pages.
Notice of Allowance and Fees Due for U.S. Appl. No. 12/683,115, dated Oct. 23, 2013, 07 pages.
Non-Final Rejection for U.S. Appl. No. 12/683,115, dated Sep. 17, 2013, 05 pages.
Final Rejection for U.S. Appl. No. 12/683,115, dated Jan. 4, 2012, 14 pages.
Non-Final Rejection for U.S. Appl. No. 12/683,115, dated Jun. 22, 2011, 12 pages.
Belousov et al., "Concentration and Temperature Dependencies of the Elastic Properties of Quenched Fe—Co and FeCo-2B Alloys", Russian Metallurgy, vol. 2009, No. 1, pp. 41-49.
Office Action for JP Patent Application No. 2009-005876, dated Jul. 5, 2011.

* cited by examiner (EXAMPLE 1)

(EXAMPLE 3)

(EXAMPLE 5)

(EXAMPLE 6)

(EXAMPLE 7)

(EXAMPLE 10)

(EXAMPLE 11)

FIG.13A
RECORDING OF INFORMATION "0"      RECORDING OF INFORMATION "1"
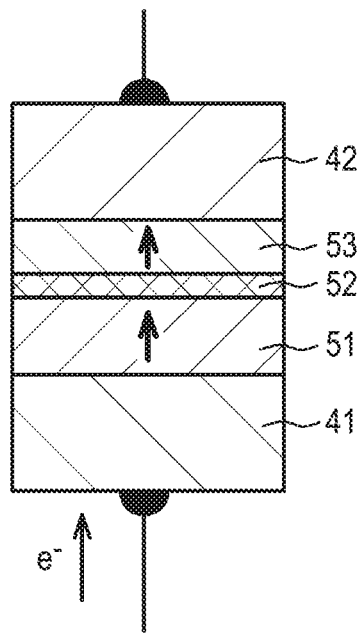
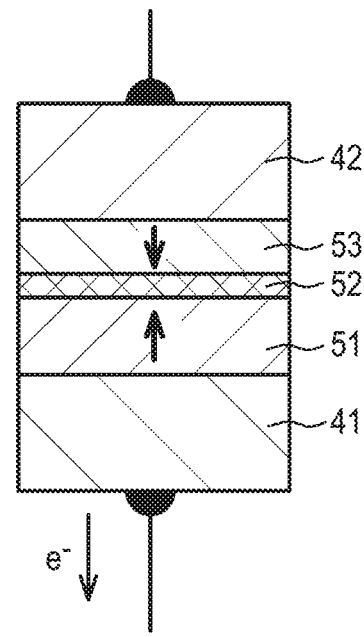
FIG.13B
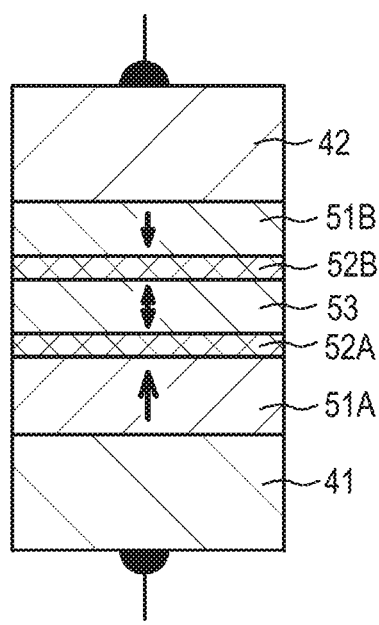

NONVOLATILE MAGNETIC MEMORY DEVICE

CROSS REFERENCE TO RELATED APPLICATIONS

The present application is a continuation application of U.S. patent application Ser. No. 15/338,783, filed Oct. 31, 2016, which is a continuation application of U.S. patent application Ser. No. 14/158,326, filed Jan. 17, 2014, now U.S. Pat. No. 9,508,919, which is a continuation of U.S. patent application Ser. No. 12/683,115, filed Jan. 6, 2010, now U.S. Pat. No. 8,659,102, which claims priority from prior Japanese Priority Patent Application JP 2009-005876 filed in the Japan Patent Office on Jan. 14, 2009, the entire contents of which are hereby incorporated by reference.

BACKGROUND OF THE INVENTION

1. Field of the Invention

The present invention relates to a nonvolatile magnetic memory device.

2. Description of Related Art

With the remarkable proliferation of information and communication equipment, particularly, personal small items such as portable terminals, various kinds of semiconductor devices of memory elements and logic elements forming the equipment are requested to have higher performance of higher integration, higher speed, lower power consumption, and the like. Especially, a nonvolatile memory is considered to be indispensable for the ubiquitous age. Even in exhaustion or trouble of a power supply, or disconnection between a server and a network due to some failure, important information can be saved and protected by the nonvolatile memory. Further, the recent portable equipment is designed to suppress the power consumption as much as possible by allowing an unnecessary circuit block to stand by. If a nonvolatile memory serving as a high-speed work memory and a large-capacity storage memory can be realized, wasted power consumption and memory can be eliminated. In addition, the "instant-on" function that enables instantaneous activation when the power is turned on can be exerted if the high-speed and large-capacity storage nonvolatile memory can be realized.

As the nonvolatile memory, a flash memory using a semiconductor material and a ferroelectric random access memory (FERAM) using a ferroelectric material, and the like may be cited. However, the flash memory has a disadvantage with a slow writing speed in the order of microseconds. On the other hand, in the FERAM, the rewritable times is 1012 to 1014. The problems that the rewritable times of the FERAM are not sufficient for replacement of an SRAM or DRAM with the FERAM, and microfabrication of the ferroelectric layer is difficult are pointed out.

As a nonvolatile memory that does not have these disadvantages, a nonvolatile magnetic memory element called an MRAM (magnetic random access memory) attracts attention. Among the MRAMs, an MRAM using a TMR (tunnel magnetoresistance) effect attracts a lot of attention because of the recent improvement in characteristics of the TMR material. The TMR-type MRAM has a simple structure and is easy to be scaled, and has many rewritable times because recording is performed by the rotation of magnetic moment. Furthermore, a very high speed is expected with respect to the access time, and it is said that the MRAM has already been operable at 100 MHz.

Now, in the MRAM, in order to stably hold the recorded information, it is necessary that the recording layer for recording information has a certain coercive force. On the other hand, in order to rewrite the recorded information, a certain degree of current should be flown in the bit-line. However, with the miniaturization of the MRAM, the bit-lines become thinner, and it is becoming difficult to flow a sufficient current. Accordingly, as a configuration capable of magnetization reversal with a smaller current, a spin injection magnetoresistance-effect element using magnetization reversal by spin injection attracts attention (e.g., see JP-A-2003-17782). Here, the magnetization reversal by spin injection is a phenomenon that electrons spin-polarized through a magnetic material are injected into another magnetic material, and thereby, magnetization reversal occurs in the other magnetic material. In the spin injection magnetoresistance-effect element, compared to the MRAM, the device structure can be made simpler. Further, since the magnetization reversal by spin injection is utilized, compared to the MRAM in which magnetization reversal is performed by an external magnetic field, the element has advantages that the writing current is not increased even when the miniaturization of the element is advanced and that the cell area can be reduced. However, with miniaturization, deterioration in data retention characteristic due to thermal disturbance becomes problematic.

In an in-plane magnetization-type spin injection magnetoresistance-effect element in related art, shape magnetic anisotropy of the recording layer is utilized for recording and holding data. Further, in order to solve the problem of deterioration in data retention characteristic due to thermal disturbance or the like, the ratio of a length along the axis of easy magnetization to a length of the axis of hard magnetization (aspect ratio) of the recording layer is largely taken. Hence, in the solution, it is difficult to further reduce the cell size.

SUMMARY OF THE INVENTION

On the other hand, a perpendicular magnetization-type spin injection magnetoresistance-effect element in which the axis of easy magnetization in the recording layer is oriented in a perpendicular direction has a structure independent of shape magnetic anisotropy for retention of data, and the cell size can be reduced. However, generally, a material having crystal magnetic anisotropy in the perpendicular direction has low polarizability, and has small MR (magneto resistive). On the other hand, a material having high polarizability has crystal magnetic anisotropy in the in-plane direction, and therefore, is difficult to use for the perpendicular magnetization-type. A method for solving the problem is disclosed in JP-T-2007-525847, for example. In the method, a stress increasing layer is inserted into the recording layer provided in the spin injection magnetoresistance-effect element, and magnetic anisotropy is provided by magnetostriction. However, since the stress increasing layer is inserted into the recording layer, the magnetic characteristic is deteriorated and the polarizability is reduced, and thereby, MR may be reduced.

Therefore, there is need for a perpendicular magnetization-type nonvolatile magnetic memory device having an axis of easy magnetization in a recording layer oriented in a perpendicular direction and a configuration and a structure that can more reliably orient the axis of easy magnetization in the recording layer.

A nonvolatile magnetic memory device according to a first embodiment of the invention includes a magnetoresistance-effect element including:

(A) a laminated structure having a recording layer in which an axis of easy magnetization is oriented in a perpendicular direction;
(B) a first wiring line electrically connected to a lower part of the laminated structure; and
(C) a second wiring line electrically connected to an upper part of the laminated structure, wherein a high Young's modulus region having a Young's modulus of a higher value than that of a Young's modulus of a material forming the recording layer is provided close to a side surface of the laminated structure.

A nonvolatile magnetic memory device according to a second embodiment of the invention includes a magnetoresistance-effect element including:

(A) a laminated structure having a recording layer in which an axis of easy magnetization is oriented in a perpendicular direction;
(B) a first wiring line electrically connected to a lower part of the laminated structure; and
(C) a second wiring line electrically connected to an upper part of the laminated structure, wherein a low Young's modulus region having a Young's modulus of a lower value than that of a Young's modulus of a material forming the recording layer is provided above the laminated structure, below the laminated structure, or above and below the laminated structure.

In the nonvolatile magnetic memory device according to the first embodiment of the invention, the high Young's modulus region having a Young's modulus of a higher value than that of the Young's modulus of the material forming the recording layer is provided close to the side surface of the laminated structure. Therefore, compression stress is applied to the recording layer, and the perpendicular magnetic anisotropy and the magnetic resistive of the recording layer are increased. Further, in the nonvolatile magnetic memory device according to the second embodiment of the invention, the low Young's modulus region (high stress region) having a Young's modulus of a lower value than that of the Young's modulus of the material forming the recording layer is provided above and/or below the laminated structure. Therefore, internal stress occurs in the recording layer and the perpendicular magnetic anisotropy and the magnetic resistive of the recording layer are increased. Further, as a result, the axis of easy magnetization in the recording layer can more reliably be oriented.

BRIEF DESCRIPTION OF THE DRAWINGS

FIG. 13A is a conceptual diagram of a spin injection magnetoresistance-effect element using spin injection magnetization reversal and a schematic plan view of a magnetization reversal layer, and FIG. 13B is a conceptual diagram of a spin injection magnetoresistance-effect element having a double spin filter structure.

DESCRIPTION OF PREFERRED INVENTION

Figure 1:
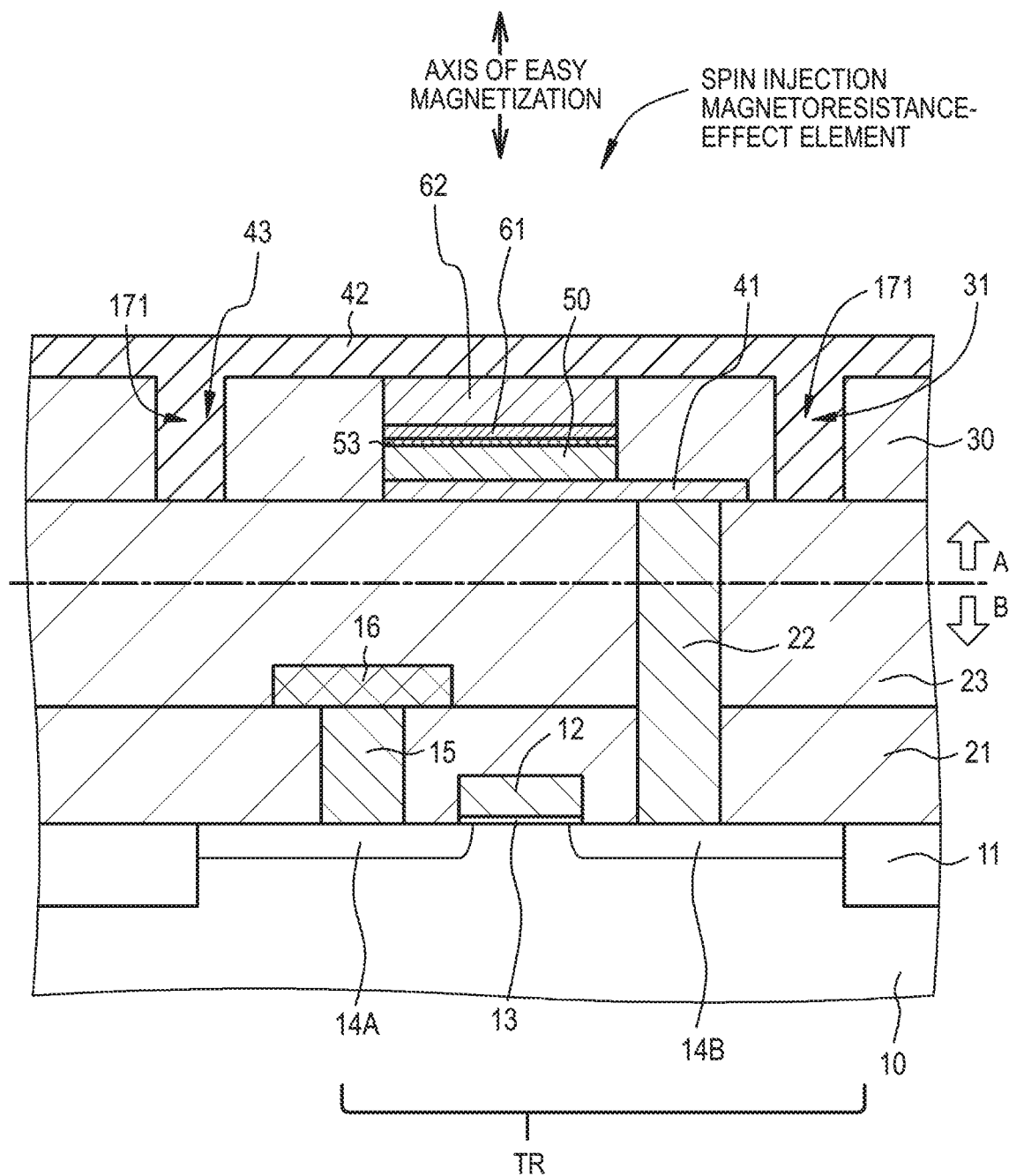
FIG. 1 is a schematic partial sectional view of a nonvolatile magnetic memory device of example 1.

The invention will be described according to examples with reference to the drawings, and the invention is not limited to the examples and various numeric values and materials in the examples are shown for illustrative purpose. The explanation will be made in the following order.
1. General explanation of nonvolatile magnetic memory device according to first embodiment and second embodiment of the invention
2. Example 1 (nonvolatile magnetic memory device according to first embodiment of the invention)
3. Example 2 (modification of example 1)
4. Example 3 (modification of example 2)
5. Example 4 (nonvolatile magnetic memory device according to second embodiment of the invention)
6. Example 5 (modification of example 4)
7. Example 6 (modification of example 4 and example 5)
8. Example 7 (another modification of example 4)
9. Example 8 (modification of example 5)
10. Example 9 (modification of example 6)
11. Example 10 (yet another modification of example 4)
12. Example 11 (still another modification of example 4 and others)

[General Explanation of Nonvolatile Magnetic Memory Device According to First Embodiment and Second Embodiment of the Invention]

A nonvolatile magnetic memory device according to the second embodiment of the invention may have a configuration in which a high Young's modulus region having a Young's modulus of a higher value than that of a Young's modulus of a material forming a recording layer is provided close to a side surface of a laminated structure. Such a configuration is referred to as "nonvolatile magnetic memory device having a 2A-configuration" for convenience.

In a nonvolatile magnetic memory device according to the first embodiment of the invention or the nonvolatile magnetic memory device having the 2A-configuration, compression stress is applied to a recording layer by providing the high Young's modulus region, and the perpendicular magnetic anisotropy of the recording layer is increased. Further, a laminated structure may have a magnetization reference layer and may have a form in which compression stress is applied to the recording layer and the magnetization reference layer by providing the high Young's modulus region and the perpendicular magnetic anisotropy of the recording layer and the magnetization reference layer is increased. By adopting the form, the perpendicular magnetic anisotropy of the recording layer is further increased and an axis of easy magnetization of the recording layer can more reliably be oriented in a perpendicular direction.

In the nonvolatile magnetic memory device according to the first embodiment of the invention having the above described preferred form and configuration or the nonvolatile magnetic memory device having the 2A-configuration, not limited, but the high Young's modulus region may have a configuration extending from the second wiring line.

It is preferable that the nonvolatile magnetic memory device according to the first embodiment of the invention having the above described preferred form and configuration or the nonvolatile magnetic memory device having the 2A-configuration may satisfy the following expressions $$EH-E0 \geq 1 \times 10^{11} \text{ Pa}(100 \text{ GPa})$$

preferably, $$EH-E0 \geq 3 \times 10^{11} \text{ Pa}(300 \text{ GPa})$$

where the Young's modulus of the high Young's modulus region is EH and the Young's modulus of the material forming the recording layer is E0. As a material forming the high Young's modulus region, a conducting material may be cited. Specifically, the high Young's modulus region may have a configuration including at least one kind of material selected from the group consisting of iridium (Ir), rhenium (Re), rhodium (Rh), ruthenium (Ru), molybdenum (Mo), tungsten (W), titanium nitride (TiN), titanium boride (TiB2), zirconium boride (ZrB2), zirconium nitride (ZrN), vanadium boride (VB2), niobium boride (NbB2), tantalum boride (TaB2), chromium boride (CrB2), molybdenum boride (Mo2B5), tungsten boride (W2B5), niobium carbide (NbC), tantalum carbide (TaC), and tungsten carbide (WC). Alternatively, a material forming the high Young's modulus region may appropriately be selected from materials having Young's moduli equal to or more than $3 \times 10^{11}$ Pa, for example. Or, a material forming the high Young's modulus region may appropriately be selected from materials that can apply compression stress from $1 \times 10^8$ Pa to $5 \times 10^9$ Pa to the recording layer.

In the nonvolatile magnetic memory device according to the second embodiment of the invention including the nonvolatile magnetic memory device having the 2A-configuration including the above described preferred form and configuration, internal stress occurs in the recording layer by providing a low Young's modulus region and the perpendicular magnetic anisotropy of the recording layer is increased. Further, a laminated structure may have a magnetization reference layer and may have a form in which internal stress occurs in the recording layer and the magnetization reference layer by providing the low Young's modulus region and the perpendicular magnetic anisotropy of the recording layer and the perpendicular magnetization anisotropy of the magnetization reference layer is increased. By adopting the form, the perpendicular magnetic anisotropy of the recording layer is further increased and an axis of easy magnetization of the recording layer can more reliably be oriented in a perpendicular direction.

Furthermore, the nonvolatile magnetic memory device according to the second embodiment of the invention including the nonvolatile magnetic memory device having the 2A-configuration including the above described preferred form and configuration may have a configuration in which the low Young's modulus region is provided between an upper part of the laminated structure and the second wiring line. Alternatively, the device may have a configuration in which the low Young's modulus region is provided between a lower part of the laminated structure and the first wiring line. Or, the device may have a configuration in which a first low Young's modulus region is provided between the lower part of the laminated structure and the first wiring line and a second low Young's modulus region is provided between the upper part of the laminated structure and the second wiring line. In the configuration in which the low Young's modulus region (or the second low Young's modulus region) is provided between the upper part of the laminated structure and the second wiring line, a connection part is provided between the upper part of the laminated structure and the second wiring line, and the connection part may have a form corresponding to the low Young's modulus region (or the second low Young's modulus region), or may have a form adopting the laminated structure of the second wiring line and the low Young's modulus region (or the second low Young's modulus region) at least near the laminated structure. Similarly, in the configuration in which the low Young's modulus region (or the first low Young's modulus region) is provided between the lower part of the laminated structure and the first wiring line, a connection part is provided between the lower part of the laminated structure and the first wiring line, and the connection part may have a form corresponding to the low Young's modulus region (or the first low Young's modulus region), or may have a form adopting the laminated structure of the first wiring line and the low Young's modulus region (or the first low Young's modulus region) at least near the laminated structure. Or, the low Young's modulus region may be provided above the upper part of the laminated structure with the second wiring line in between, the low Young's modulus region may be provided below the lower part of the laminated structure with the first wiring line in between, or the first low Young's modulus region may be provided below the lower part of the laminated structure with the first wiring line in between and the second low Young's modulus region may be provided above the upper part of the laminated structure with the second wiring line in between.

Furthermore, it is preferable that the nonvolatile magnetic memory device according to the second embodiment of the invention including the nonvolatile magnetic memory device having the 2A-configuration including the above described preferred form and configuration may satisfy the following expressions $$E0-EL \geq 1 \times 10^{11} \text{ Pa}(100 \text{ GPa})$$

preferably, $$E0-EL \geq 3 \times 10^{11} \text{ Pa}(300 \text{ GPa})$$

where the Young's modulus of the low Young's modulus region is EL and the Young's modulus of the material forming the recording layer is E0. As a material forming the low Young's modulus region, a conducting material or an insulating material may be cited, or, according to circumstances, the low Young's modulus region may be formed by a cavity. Here, in the case where the low Young's modulus region is formed by a conducting material, the low Young's modulus region may have a configuration including at least one kind of metal selected from the group consisting of gold (Au), silver (Ag), zinc (Zn), copper (Cu), magnesium (Mg), aluminum (Al), indium (In), tin (Sn), lead (Pb), niobium (Nb), and titanium (Ti), or an alloy (e.g., Cu alloy or Al alloy) of the metals.

In the nonvolatile magnetic memory devices according to the first embodiment and the second embodiment including various kinds of the above described preferred embodiments and configurations, a magnetoresistance-effect element may include a spin injection magnetoresistance-effect element.

Young's modulus values of various metal materials and metal alloy materials are shown in the following table 1 for illustrative purpose.

TABLE 1

| Metal (alloy) | Young's modulus (GPa) | Metal (alloy) | Young's modulus (GPa) |
|---|---|---|---|
| Ir | 529 | NbB2 | 630 |
| Re | 460 | NbC | 580 |
| Rh | 359 | TaB2 | 680 |
| Ru | 414 | TaC | 560 |
| Mo | 324 | CrB2 | 540 |
| W | 345 | Mo2B5 | 670 |
| TiN | 590 | W2B5 | 770 |
| TiB2 | 560 | WC | 720 |
| ZrB2 | 540 | Cu | 110 |
| ZrN | 510 | Ti | 116 |
| VB2 | 510 | Ta | 186 |

In the nonvolatile magnetic memory devices according to the first embodiment and the second embodiment including various kinds of the above described preferred forms and configurations (hereinafter, these nonvolatile magnetic memory devices may be collectively and simply referred to as "nonvolatile magnetic memory devices according to the embodiments of the invention", it is desirable that the solid shape of the laminated structure is cylindrical in view of securement of workability and uniformity of the direction of the axis of easy magnetization in the recording layer.

Further, in the nonvolatile magnetic memory device according to the first embodiment of the invention, as the solid shape of the high Young's modulus region provided close to the side surface of the laminated structure, a hollow cylindrical shape may be cited. An insulating material layer or an insulator film may be provided between the high Young's modulus region and the side surface of the laminated structure.

On the other hand, in the nonvolatile magnetic memory device according to the second embodiment of the invention, as the solid shape of the low Young's modulus region, a disc shape or cylindrical shape may be cited. In the case where the low Young's modulus region (or the second low Young's modulus region) is provided between the upper part of the laminated structure and the second wiring line, or the low Young's modulus region (or the first low Young's modulus region) is provided between the lower part of the laminated structure and the first wiring line, the solid shapes of these low Young's modulus regions may be disk shapes or cylindrical shapes having the same diameter as that of the cylindrical laminated structure or diameters larger than that (e.g., diameters equal to or more than twice the diameter as that of the cylindrical laminated structure). In the case where the connection part corresponds to the low Young's modulus region (or the first low Young's modulus region or the second low Young's modulus region), the solid shape of the low Young's modulus region (or the first low Young's modulus region or the second low Young's modulus region) may be a disk shape or cylindrical shape having the same diameter as that of the cylindrical laminated structure. On the other hand, in the case where the low Young's modulus region (or the second low Young's modulus region) is provided above the upper part of the laminated structure with the second wiring line in between, or the low Young's modulus region (or the first low Young's modulus region) is provided below the lower part of the laminated structure with the first wiring line in between, the solid shapes of these low Young's modulus regions may be disk shapes or cylindrical shapes having the same diameter as that of the cylindrical laminated structure or diameters larger than that (e.g., diameters equal to or more than twice the diameter as that of the cylindrical laminated structure).

The spin injection magnetoresistance-effect element may have a structure in which a laminated structure having a TMR effect or a GMR effect is formed by a magnetization reference layer (also called an anchoring layer), a nonmagnetic material film, a recording layer for storing information (also called a magnetization reversal layer or free layer). Further, when a spin-polarized current is flown from the recording layer to the magnetization reference layer, spin-polarized electrons are injected from the magnetization reference layer to the recording layer, and the magnetization direction of the magnetization reference layer and the magnetization direction of the recording layer are aligned in parallel. On the other hand, when a spin-polarized current is flown from the magnetization reference layer to the recording layer, spin-polarized electrons are injected from the recording layer to the magnetization reference layer, the electron having a spin in parallel to the magnetization reference layer is transmitted, the electron having a spin in antiparallel to the magnetization reference layer is reflected, and, as a result, the magnetization direction of the recording layer and the magnetization direction of the magnetization reference layer are aligned in antiparallel. Alternatively, the element may have a structure in which a laminated structure having a TMR effect or a GMR effect is formed by a magnetization reference layer, a nonmagnetic material film, a recording layer, a nonmagnetic material film, and a magnetization reference layer. In such a structure, it is necessary to provide a difference between changes in magneto resistives between the two nonmagnetic material films located on and beneath the recording layer.

As a material forming the recording layer, an alloy of ferromagnetic materials such as nickel (Ni), iron (Fe), and cobalt (Co) (e.g., Co—Fe, Co—Fe—B, Co—Fe—Ni, Fe—Pt, Ni—Fe, or the like), or an alloy formed by adding gadolinium (Gd) to the alloys may be exemplified. Further, in order to further increase the perpendicular magnetic anisotropy, a heavy rare earth such as terbium (Tb), dysprosium (Dy), or holmium (Ho) may be added to the alloy, or alloys containing them may be stacked. The crystallinity of the recording layer is inherently arbitrary, and it may be polycrystal, single-crystal, or amorphous. Further, the recording layer may have a single-layer configuration, a multilayer configuration formed by laminating the plural different ferromagnetic material layers as described above, or a multilayer configuration formed by laminating ferromagnetic material layers and nonmagnetic material layers.

The laminated structure having a TMR effect formed by the magnetization reference layer, the nonmagnetic material film, and the recording layer refers to a structure in which the nonmagnetic material film that functions as a tunnel insulator film is sandwiched between the magnetization reference layer including a magnetic material and the recording layer including a magnetic material. Further, as the electric connection condition between the magnetization reference layer and the first wiring line (or the second wiring line), a form in which the first wiring line (or the second wiring line) is directly connected to the magnetization reference layer may be cited, or a form in which the first wiring line (or the second wiring line) is connected via an antiferromagnetic material layer to the magnetization reference layer may be cited. The spin-polarized current is injected into the recording layer from the first wiring line via the magnetization reference layer when the magnetization reference layer is connected to the first wiring line, or from the second wiring line via the magnetization reference layer when the magnetization reference layer is connected to the second wiring line, and thereby, the direction of magnetization in the recording layer is oriented in the first direction (the direction in parallel to the axis of easy magnetization) or the second direction (the opposite direction to the first direction) and information is written in the recording layer.

As a material forming the magnetization reference layer, the above described materials forming the recording layer may be cited, or Co—Tb, Co—Pt may be cited. Further, the magnetization reference layer may have a configuration having a laminated ferrimagnetic structure [a laminated structure having antiferromagnetic coupling, also called a synthetic antiferromagnet (SAF)] or may have a configuration having magnetostatic coupling, or an antiferromagnetic material layer may be provided adjacent to the magnetization reference layer. The laminated ferrimagnetic structure refers to a structure having a three-layer structure of magnetic material layer/ruthenium (Ru) layer/magnetic material layer, for example, (specifically, a three-layer structure of CoFe/Ru/CoFe, or a three-layer structure of CoFeB/Ru/CoFeB, for example), and having interlayer exchange coupling between the two magnetic material layers becoming antimagnetic or ferromagnetic depending on the thickness of the ruthenium layer. For instance, the structure is reported in S. S., Parkin et al., Physical Review Letters, 7 May, pp. 2304-2307 (1990). Note that a structure having interlayer exchange coupling between the two magnetic material layers becoming antimagnetic is called a laminated ferrimagnetic structure. Further, a structure having the two magnetic material layers in which the antiferromagnetic coupling is obtained by the leakage field from the end surfaces of the magnetic material layers is called a magnetostatic coupling structure.

As a material forming the antiferromagnetic material layer, an iron-manganese alloy, a nickel-manganese alloy, a platinum-manganese alloy, an iridium-manganese alloy, a rhodium-manganese alloy, cobalt oxide, and nickel oxide may be cited. In order to improve crystallinity of the antiferromagnetic material layer, a foundation film including Ta, Cr, Ru, Ti, or the like may be formed between the first wiring line (or the second wiring line) and the antiferromagnetic material layer.

As a material forming the nonmagnetic material film forming the laminated structure having the TMR effect in the spin injection magnetoresistance-effect element, an insulating material such as magnesium oxide (MgO), magnesium nitride, aluminum oxide (AlOX), aluminum nitride (AlN), silicon oxide, silicon nitride, TiO2 or Cr2O3, Ge, NiO, CdOX, HfO2, Ta2O5, BN, or ZnS may be cited. On the other hand, as a material forming the nonmagnetic material film forming the laminated structure having the GMR effect, a conducting material such as Cu, Ru, Cr, Au, Ag, Pt, or Ta, and an alloy of these materials may be cited. If the conductivity is high (the resistivity is several hundreds of microhms·cm or less), the material may be an optional nonmagnetic material, and it is desirable that a material hard to produce an interfacial reaction with the recording layer and the magnetization reference layer is appropriately selected.

The nonmagnetic material film including an insulating material can be obtained by oxidizing or nitriding a metal film formed by a sputtering method, for example. More specifically, when aluminum oxide (AlOX) or magnesium oxide (MgO) is used as the insulating material forming the nonmagnetic material film, for example, a method of oxidizing aluminum or magnesium formed by a sputtering method in the atmosphere, a method of plasma-oxidizing aluminum or magnesium formed by a sputtering method in the atmosphere, a method of oxidizing aluminum or magnesium formed by a sputtering method with IPC plasma, a method of naturally oxidizing aluminum or magnesium formed by a sputtering method in oxygen, a method of oxidizing aluminum or magnesium formed by a sputtering method with oxygen radical, a method of naturally oxidizing aluminum or magnesium formed by a sputtering method in oxygen while applying ultraviolet light, a method of depositing aluminum or magnesium by a reactive sputtering method, and a method of depositing aluminum oxide (AlOX) or magnesium oxide (MgO) by a sputtering method may be exemplified.

The above described various layers can be formed by a physical vapor deposition method (PVD method) exemplified by a sputtering method, an ion beam deposition method, and a vacuum deposition method, or a chemical vapor deposition method (CVD method) represented by an ALD (Atomic Laser Deposition) method. Further, patterning of these layers can be performed by a reactive ion etching method (RIE method) or an ion milling method (ion beam etching method).

The first wiring line and the second wiring line have single-layer structures of Cu, Al, Au, Pt, Ti, or the like, or may have a laminated structure of a foundation layer including Cr, Ti, or the like, and a Cu layer, an Au layer, a Pt layer, or the like formed thereon. Further, the wiring lines may have single-layer structures of Ta or the like or laminated structures with Cu, Ti, or the like. These electrodes may be formed by a PVD method exemplified by a sputtering method. Note that, in the case of a configuration in which the high Young's modulus region extends from the second wiring line, the material forming the second wiring line may be appropriately selected from the above described materials forming the high Young's modulus region.

It is preferable that the nonvolatile magnetic memory device according to the embodiments of the invention may further have a selection transistor of a field-effect transistor below the laminated structure, and the direction in which the second wiring line (e.g., a bit-line) extends may be in parallel to the direction in which a gate electrode forming the field-effect transistor extends. However, not limited to that, but the projection image in the direction in which the second wiring line extends may be orthogonal to the projection image in the direction in which the gate electrode forming the field-effect transistor extends. Or, according to circumstances, the selection transistor is unnecessary.

The preferred configuration in the nonvolatile magnetic memory device may further have a selection transistor of a field-effect transistor below the laminated structure as described above. As a more specific configuration, for example, though not for limitation, a configuration including a selection transistor formed on a semiconductor substrate, and an underlayer insulating layer covering the selection transistor, wherein the first wiring line is formed on the underlayer insulating layer, the first wiring line is electrically connected to the selection transistor via a connection hole (or a connection hole and a landing pad or an under layer wiring line) provided in the underlayer insulating layer, an interlayer insulating layer covers the underlayer insulating layer and the first wiring line and surrounds the laminated structure, and the second wiring line is formed on the interlayer insulating layer may be exemplified.

The selection transistor may be formed by a known MIS-type FET or a MOS-type FET, for example. The connection hole that electrically connects the first wiring line and the selection transistor may include a high-melting-point metal or metal silicide such as polysilicon doped with impurity, tungsten, Ti, Pt, Pd, Cu, TiW, TiNW, WSi2, or MoSi2, and may be formed according to the PVD method exemplified by the CVD method and the sputtering method. Further, as a material forming the underlayer insulating layer, silicon oxide (SiO2), silicon nitride (SiN), SiON, SOG, NSG, BPSG, PSG, BSG, or LTO may be exemplified.

Example 1

Figure 2:
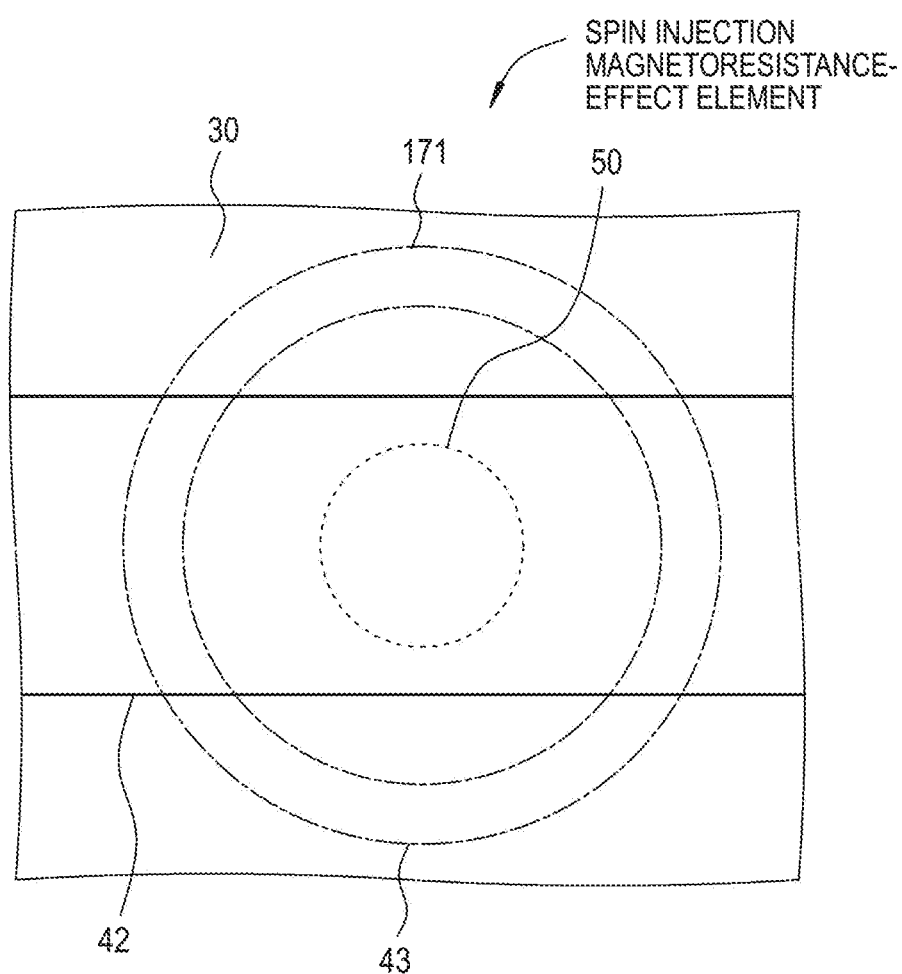
FIG. 2 schematically shows an arrangement condition of a laminated structure, a first wiring line, a second wiring line, and a high Young's modulus region in the nonvolatile magnetic memory device of example 1.

Example 1 relates to a nonvolatile magnetic memory device according to the first embodiment of the invention. FIG. 1 is a schematic partial sectional view of the nonvolatile magnetic memory device of example 1, and FIG. 2 schematically shows an arrangement condition of a laminated structure, a first wiring line, a second wiring line, and a high Young's modulus region.

The nonvolatile magnetic memory device of example 1 includes a magnetoresistance-effect element including:

(A) a laminated structure 50 having a recording layer 53 in which an axis of easy magnetization is oriented in a perpendicular direction;

(B) a first wiring line 41 electrically connected to a lower part of the laminated structure 50; and (C) a second wiring line 42 electrically connected to an upper part of the laminated structure 50. In example 1 to example 11, the magnetoresistance-effect element includes a spin injection magnetoresistance-effect element using magnetization reversal by spin injection.

In the schematic partial sectional view of the nonvolatile magnetic memory device, for a reason of the drawing, in the upper "A" region and the lower "B" region than the dashed-dotted line, the directions in which the section of the nonvolatile magnetic memory device is seen are different by 90 degrees. That is, in the "A" region, the section of the nonvolatile magnetic memory device is seen from a first direction, and, in the "B" region, the section of the nonvolatile magnetic memory device is seen from a direction orthogonal to the first direction. Accordingly, in the drawing, the projection image of the second wiring line (a bit-line in example 1 to example 11) 42 in the extending direction and the projection image of a gate electrode 12 forming a field-effect transistor in the extending direction are orthogonally shown, however, they are in parallel in fact.

Further, in the nonvolatile magnetic memory device of example 1, a high Young's modulus region 171 having a Young's modulus of a higher value than that of a Young's modulus of a material forming the recording layer 53 is further provided close to a side surface of the laminated structure 50. Here, by providing the high Young's modulus region 171, compression stress is applied to the recording layer 53, and the perpendicular magnetic anisotropy of the recording layer 53 is increased.

In example 1, the high Young's modulus region 171 extends from the second wiring line 42. That is, the high Young's modulus region 171 includes an extending part 43 of the second wiring line 42. Further, the laminated structure 50 has a magnetization reference layer 51, and compression stress is applied to the recording layer 53 and the magnetization reference layer 51 by providing the high Young's modulus region 171 and the perpendicular magnetic anisotropy of the recording layer 53 and the magnetization reference layer 51 is increased. Hence, the perpendicular magnetic anisotropy of the recording layer 53 is further increased and an axis of easy magnetization of the recording layer 53 can more reliably be oriented in the perpendicular direction.

The solid shape of the laminated structure 50 is a cylindrical shape in view of securement of workability and uniformity of the direction of the axis of easy magnetization in the recording layer 53. Further, the solid shape of the high Young's modulus region 171 is a hollow cylindrical shape surrounding the laminated structure 50. Note that an interlayer insulating layer 30 is provided between the side surface of the laminated structure 50 and the high Young's modulus region 171.

A connection part 62 is provided between the upper part of the laminated structure 50 and the second wiring line 42. Further, a cap layer 61 including a Ta layer having a thickness of about 5 nm is formed by a sputtering method between the laminated structure 50 and the connection part 62. The cap layer 61 serves to prevent interdiffusion between atoms forming the wiring line and the connection part 62 and atoms forming the recording layer 53, to reduce contact resistance, and to prevent oxidation of the recording layer 53. Note that, as the cap layer, in addition, a Ru layer, a Pt layer, an MgO layer, a laminated structure of a Ru film/Ta film may be cited.

Furthermore, a selection transistor TR of a field-effect transistor is provided below the laminated structure 50 (more specifically, below the first wiring line 41). The direction in which the second wiring line (e.g., a bit-line) 42 extends is in parallel to the direction in which the gate electrode 12 forming the field-effect transistor extends. Specifically, the selection transistor TR is formed in a part of a silicon semiconductor substrate 10 surrounded by an element isolation region 11, and covered by underlayer insulating layers 21, 23. Further, one source/drain region 14B is connected to the first wiring line 41 via a connection hole 22 of a tungsten plug. Furthermore, the other source/drain region 14A is connected to a sense line 16 via a tungsten plug 15. In the drawing, the reference numeral "12" denotes the gate electrode (that functions as a so-called word line), and the reference numeral "13" denotes a gate insulator film. The same is applicable to example 2 to example 11, which will be described later.

As shown in the conceptual diagram of FIG. 13A, the laminated structure 50 has the following configuration and structure and is formed by a sputtering method. In the recording layer 53, depending on the direction in which a spin-polarized current flows, its direction of magnetization is changed to an upward direction (a direction toward the second wiring line 42) or a downward direction (a direction toward the first wiring line 41).

Specifically, the spin injection magnetoresistance-effect element in example 1 has a structure in which a magnetoresistance-effect laminated film of a laminated film having a GMR (Giant Magnetoresistance) effect or a TMR effect is sandwiched by the two wiring lines 41, 42. That is, the recording layer having a function of recording information (also called a magnetization reversal layer or free layer) 53 and the magnetization reference layer that having a fixed magnetization direction and a function as a spin filter (also called an anchoring layer) 51 have a structure laminated via a nonmagnetic material film 52, and the spin-polarized current flows perpendicularly to the film surface (e.g., see FIG. 13A). The recording layer 53 can take two or more magnetization directions (e.g., the first direction and the second direction as two directions shown by arrows in the perpendicular directions in FIG. 13A) by suitable magnetic anisotropy, and the respective magnetization directions correspond to information to be recorded. The recording layer 53 has an axis of easy magnetization in parallel to the first direction and the second direction and an axis of hard magnetization in a direction orthogonal to the first direction and the second direction. The magnetization reference layer 51 has its magnetization direction fixed. A double spin filter structure with improved efficiency of spin injection magnetization reversal in which magnetization reference layers 51A, 51B are provided on and under the recording layer 53 via nonmagnetic material films 52A, 52B is known (see FIG. 13B). The nonmagnetic material films 52, 52A, 52B are formed by a metal material or an insulating material. The nonvolatile magnetic memory device (spin injection magnetoresistance-effect element) using spin injection magnetization reversal has a two-terminal spin transfer element structure in which wiring lines vertically sandwich the magnetoresistance effect laminated film. Here, in example 1 to example 11, the magnetostriction constant λ of the material forming the recording layer 53 takes a positive value. Further, in example 1 to example 11, the laminated structures have the same configuration and structure.

[Laminated Structure 50]
Recording Layer 53
A laminated structure of a CoFeB layer having a thickness of about 1 nm and a TbFeCo layer having a thickness of about 3 nm
Nonmagnetic material film (tunnel insulator film) 52
An Mgo film having a thickness of 1.0 nm
Magnetization reference layer 51
A laminated structure of a CoFeB layer having a thickness of about 1 nm and a GdFeCo layer having a thickness of about 30 nm The high Young's modulus region 171 including the second wiring line 42 and the extending part 43 of the second wiring line has a groove part 31 filled with ruthenium (Ru) provided in the interlayer insulating layer 30. That is, the high Young's modulus region 171 is selected from materials having Young's moduli equal to or more than $3\times10^{11}$ Pa, and further, selected from materials that can apply compression stress of $1\times10^{8}$ Pa to $5\times10^{9}$ Pa to the recording layer 53 and the magnetization reference layer 51. Here, $EH-E0 \geq 1\times10^{11}$ Pa is satisfied. Further, specifically, the disc-shaped connection part 62 includes titanium (Ti) having a thickness of 40 nm and is formed by a sputtering method. Values of the Young's modulus EH of the high Young's modulus region 171, the Young's modulus E0 of the recording layer 53, etc. are shown in the following table 2.

On the other hand, the interlayer insulating layer 30 includes an SiO2 layer deposited by a CVD method. Further, the first wiring line 41 includes tantalum (Ta). The same is applicable to example 2 to example 11, which will be described later.

TABLE 2

| | Unit of Young's modulus: GPa | | | | |
|---|---|---|---|---|---|
| Example | First wiring line E1 | Recording layer E0 | Connection part EC | Second wiring line E2 | High Young's modulus region EH |
| 1 | 186 | 200 | 116 | 414 | Corresponding to second wiring line |
| | | | EH = E2 > E0 > EC | | |
| 2 | Same as above | Same as above | Same as above | 116 | 414 |
| | | | EH > E0 > EC > E2 | | |
| 3 | Same as above | Same as above | Same as above | Same as above | Same as above |
| | | | EH > E0 > EC > E2 | | |

As below, an outline of a manufacturing method of the nonvolatile magnetic memory device of example 1 will be explained, and nonvolatile magnetic memory devices of other examples may be fabricated basically in the same method.

[Step-100]

First, according to a known method, the element isolation region 11 is formed in a silicon semiconductor substrate 10, and the selection transistor TR including the gate insulator film 13, the gate electrode 12, the source/drain regions 14A, 14B is formed in a part of the silicon semiconductor substrate 10 surrounded by the element isolation region 11. Then, the first underlayer insulating layer 21 is formed, the tungsten plug 15 is formed in a part of the first underlayer insulating layer 21 above the source/drain region 14A, and further, the sense line 16 is formed on the first underlayer insulating layer 21. Then, the second underlayer insulating layer 23 is formed on the entire surface and the connection hole 22 of the tungsten plug is formed in parts of the underlayer insulating layers 21, 23 above the source/drain region 14B. In this way, the selection transistor TR covered by the underlayer insulating layers 21, 23 can be obtained.

[Step-110]

Then, by a sputtering method, the first wiring line 41 having a two-layer structure, the laminated structure 50, the cap layer 61, and the connection part 62 are formed on the entire surface in continuous deposition in vacuum.

[First Wiring Line 41]
Process gas: argon=100 sccm
Deposition atmosphere pressure: 0.6 Pa
DC power: 200 W
[Magnetization Reference Layer 51]
Process gas: argon=50 sccm
Deposition atmosphere pressure: 0.3 Pa
DC power: 100 W
[Nonmagnetic Material Film 52]
Process gas: argon=100 sccm
Deposition atmosphere pressure: 1.0 Pa
RF power: 500 W
[Recording Layer 53]
Process gas: argon=50 sccm
Deposition atmosphere pressure: 0.3 Pa
DC power: 200 W
[Cap Layer 61]
Process gas: argon=100 sccm
Deposition atmosphere pressure: 0.6 Pa
DC power: 200 W
[Connection Part 62]
Process gas: argon=30 sccm
Deposition atmosphere pressure: 0.7 Pa
DC power: 10 kW

[Step-120]

Then, a hard mask layer (not shown) of SiO2 is formed on the obtained first wiring line 41, laminated structure 50, cap layer 61, and connection part 62 by a biased high-density plasma CVD (HDP-CVD) method, a patterned resist layer is formed on the hard mask layer, the hard mask layer is etched by a dry-etching method, and the resist layer is removed by ashing treatment. Then, using the hard mask layer as an etching mask, the connection part 62, the cap layer 61, and the laminated structure 50 are etched according to a reactive ion etching method (RIE method), and the cylindrical laminated structure 50 as shown by a dotted line in the schematic plan view of FIG. 2 is provided. According to circumstances, etching may be performed to the recording layer 53 within the laminated structure 50, but, at this time, etching of the nonmagnetic material film (tunnel insulator film) 52 and the magnetization reference layer 51 may not be performed. Further, instead of patterning of the connection part 62, the cap layer 61, and the recording layer 53 by the RIE method, patterning can be performed according to an ion milling method (ion beam etching method). Then, an etching mask is formed, and patterning of the first wiring line 41 is performed. If the etching of the nonmagnetic material film 52 and the magnetization reference layer 51 has not yet performed, the etching of the nonmagnetic material film 52 and the magnetization reference layer 51 may be performed at this time.

[Step-130]

Then, the interlayer insulating layer 30 of SiO2 layer is deposited on the entire surface by a CVD method, and then, the interlayer insulating layer 30 and the hard mask layer are planarized by a chemical mechanical polishing method (CMP method) and the connection part 62 is exposed.

[Step-140]

Then, the groove part 31 for forming the high Young's modulus region 171 is provided in the interlayer insulating layer 30 according to a photolithography technology and a dry etching technology.

[Step-150]

Then, according to a known method, the high Young's modulus region 171 including the second wiring line 42 and the extending part 43 of the second wiring line 42 is formed on the interlayer insulating layer 30 including the inside of the groove part 31. In this manner, the nonvolatile magnetic memory device having the structure shown in FIGS. 1 and 2 can be obtained.

In the nonvolatile magnetic memory device of example 1, the high Young's modulus region 171 having the Young's modulus of the higher value than that of the Young's modulus of the material forming the recording layer 53 is provided close to the side surface of the laminated structure 50. Therefore, compression stress is applied to the recording layer 53, and the perpendicular magnetic anisotropy of the recording layer 53 is increased. As a result, the MR characteristic can be further improved, and the axis of easy magnetization in the recording layer 53 can more reliably be oriented in the perpendicular direction.

Example 2

Figure 3:
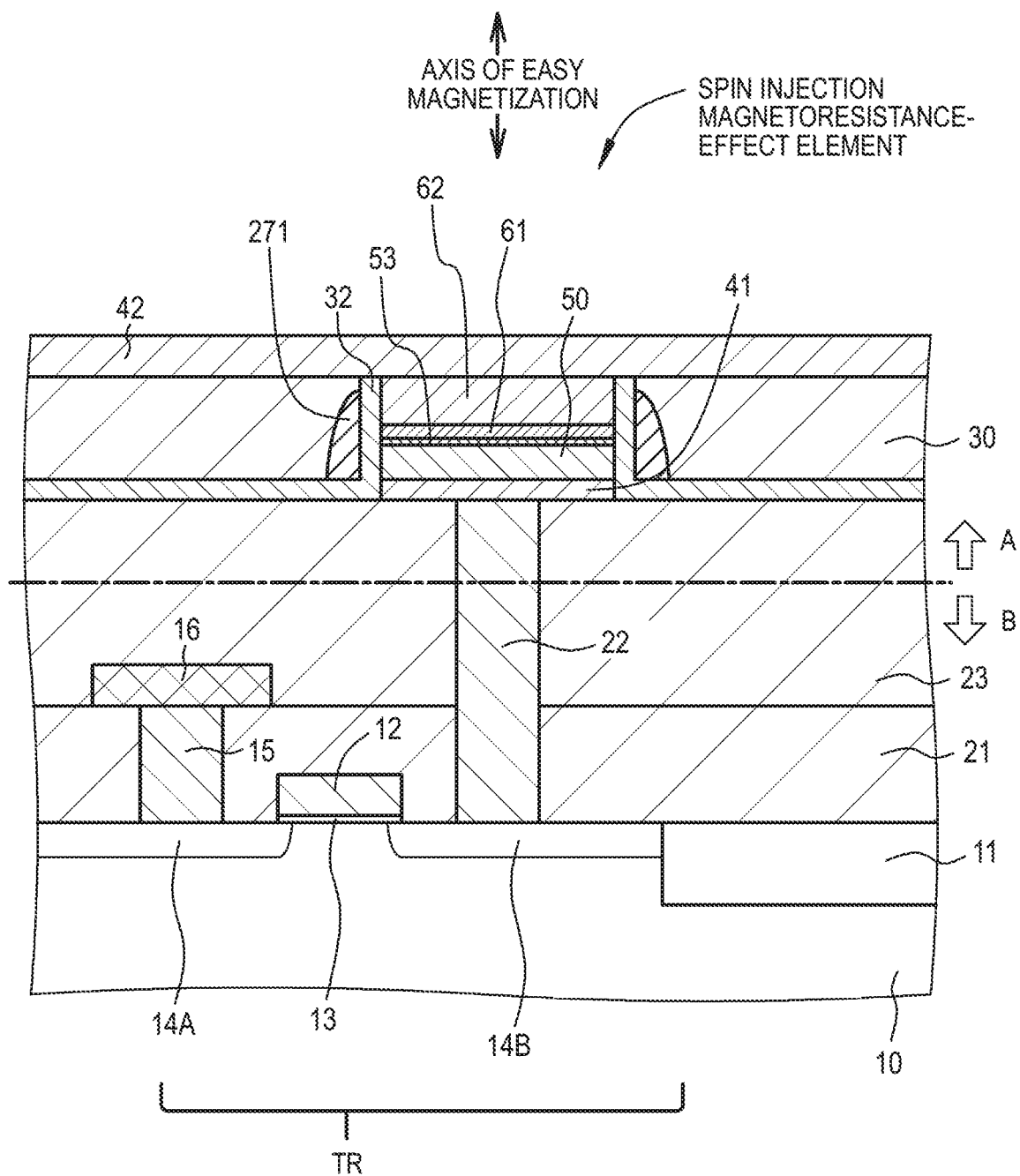
FIG. 3 is a schematic partial sectional view of a nonvolatile magnetic memory device of example 2.

Example 2 is a modification of example 1. FIG. 3 is a schematic partial sectional view of a nonvolatile magnetic memory device of example 2. In example 2, a high Young's modulus region 271 having a Young's modulus of a higher value than that of the Young's modulus of the material forming the recording layer 53 is also provided close to the side surface of the laminated structure 50. However, unlike in example 1, in example 2, an insulator film 32 is formed on the side surface of the laminated structure 50, and the high Young's modulus region 271 is formed to have a sidewall shape via the insulator film 32 on the side surface of the laminated structure 50.

In example 2, the high Young's modulus region 271 includes tungsten nitride (WN). On the other hand, the second wiring line 42 includes titanium (Ti). Values of the Young's modulus EH of the high Young's modulus region 271 etc. are shown in table 2.

Regarding the nonvolatile magnetic memory device of example 2, subsequent to [Step-120] of example 1, the hard mask layer is removed, the insulator film 32 is conformally formed on the entire surface by a CVD method, then, planarization treatment is performed on the insulator film 32 and the connection part 62 is exposed, and then, a high Young's modulus region forming layer is deposited on the entire surface, the high Young's modulus region forming layer is etched back, and thereby, the high Young's modulus region 271 can be formed to have the sidewall shape via the insulator film 32 on the side surface of the laminated structure 50. Then, the interlayer insulating layer 30 of SiO2 layer is deposited on the entire surface by a CVD method, and then, planarization treatment is performed on the interlayer insulating layer 30 and the connection part 62 is exposed. Then, according to a known method, the second wiring line 42 is formed on the interlayer insulating layer 30. In this manner, the nonvolatile magnetic memory device having the structure shown in FIG. 3 can be obtained.

Example 3

Figure 4:
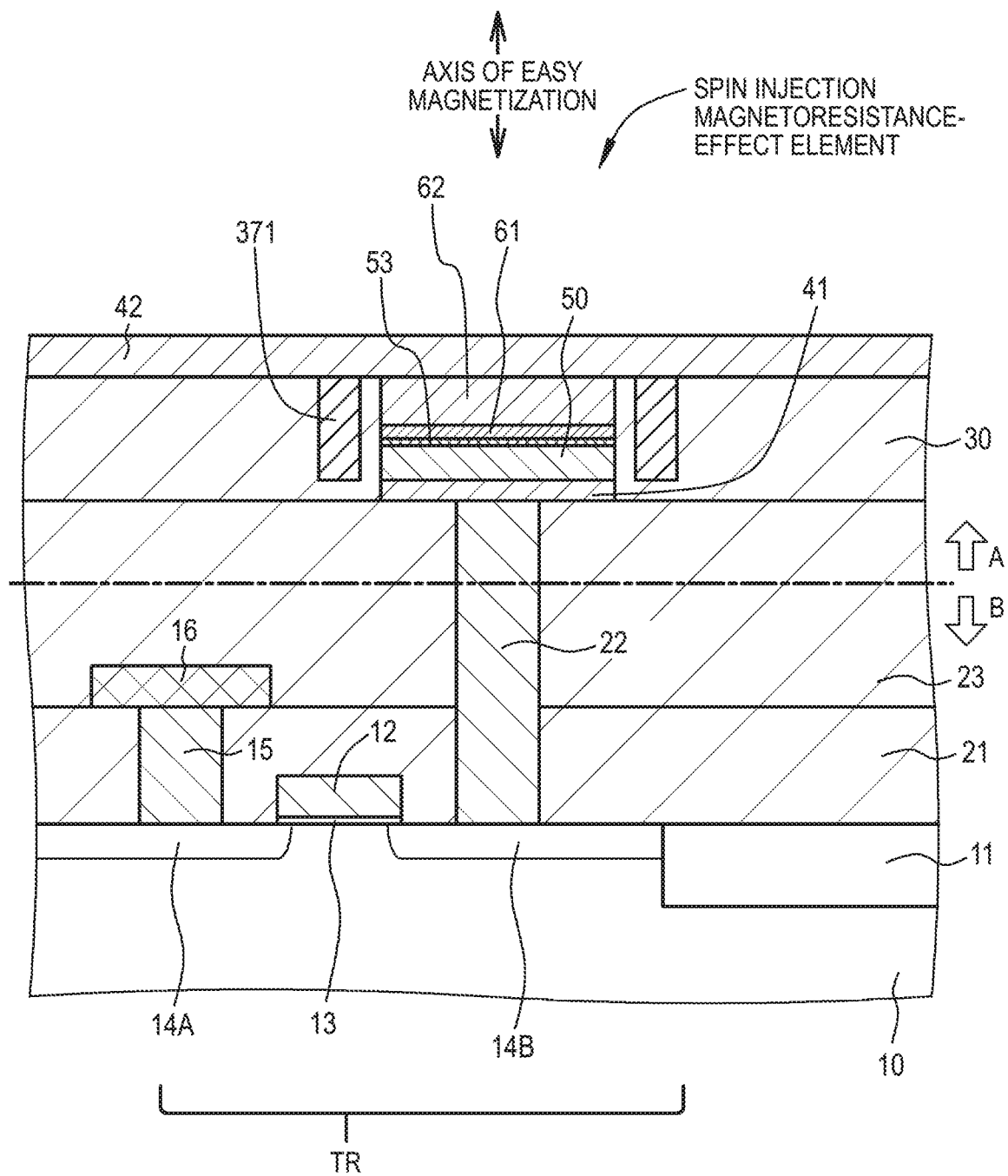
FIG. 4 is a schematic partial sectional view of a nonvolatile magnetic memory device of example 3.

Example 3 is a modification of example 2. FIG. 4 is a schematic partial sectional view of a nonvolatile magnetic memory device of example 3. In example 3, a high Young's modulus region 371 having a Young's modulus of a higher value than that of the Young's modulus of the material forming the recording layer 53 is also provided close to the side surface of the laminated structure 50. However, unlike in example 2, in example 3, the interlayer insulating layer 30 is formed on the side surface of the laminated structure 50, and the high Young's modulus region 371 is formed via the interlayer insulating layer 30 on the side surface of the laminated structure 50.

In example 3, the materials forming the high Young's modulus region 371 and the second wiring line 42 are the same as those in example 2.

Regarding the nonvolatile magnetic memory device of example 3, subsequent to [Step-130] of example 1, a groove part for forming the high Young's modulus region 371 is formed in the interlayer insulating layer 30 according to a photolithography technology and a dry-etching technology. Then, according to a known method, the high Young's modulus region forming layer is formed on the interlayer insulating layer 30 including the inside of the groove part, planarization treatment is performed on the high Young's modulus region forming layer, and the high Young's modulus region 371 is formed on the interlayer insulating layer 30. Then, according to a known method, the second wiring line 42 is formed on the interlayer insulating layer 30. In this manner, the nonvolatile magnetic memory device having the structure shown in FIG. 4 can be obtained.

Example 4

Figure 5:
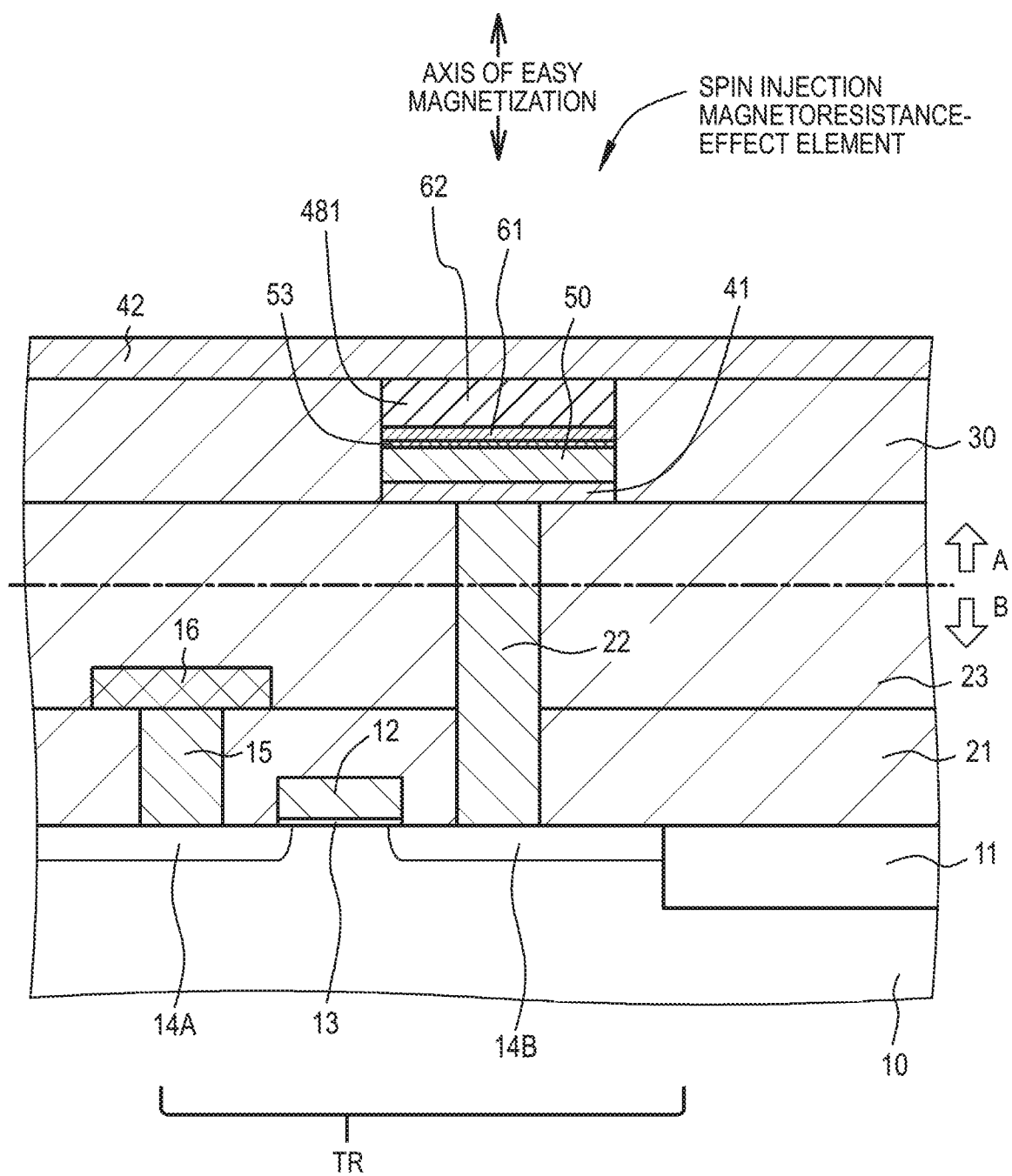
FIG. 5 is a schematic partial sectional view of a nonvolatile magnetic memory device of example 4.

Example 4 relates to a nonvolatile magnetic memory device according to the second embodiment of the invention. FIG. 5 is a schematic partial sectional view of the nonvolatile magnetic memory device of example 4.

The nonvolatile magnetic memory device of example 4 includes a magnetoresistance-effect element including:
(A) a laminated structure 50 having a recording layer 53 in which an axis of easy magnetization is oriented in a perpendicular direction;
(B) a first wiring line 41 electrically connected to a lower part of the laminated structure 50; and
(C) a second wiring line 42 electrically connected to an upper part of the laminated structure 50.

Here, the solid shape of the laminated structure 50 is a cylindrical shape in view of securement of workability and uniformity of the direction of the axis of easy magnetization in the recording layer 53. Further, in the nonvolatile magnetic memory device of example 4, a low Young's modulus region 481 having a Young's modulus EL of a lower value than that of a Young's modulus E0 of a material forming the recording layer 53 is further provided above the laminated structure 50. Note that, by providing the low Young's modulus region 481, internal stress occurs in the recording layer 53 and the perpendicular magnetic anisotropy of the recording layer 53 is increased. Further, in example 4, the laminated structure 50 and the second wiring line 42, and a connection part 62 is provided between the upper part of the laminated structure 50 and the second wiring line 42. In example 4, the connection part 62 corresponds to the low Young's modulus region 481.

More specifically, the connection part 62 (low Young's modulus region 481) includes niobium having a thickness of 40 nm and is formed by a sputtering method. The shape of the low Young's modulus region 481 is a disc shape.

Further, the second wiring line 42 includes aluminum (Al) having a thickness of about 0.1 μm, and is formed by a sputtering method. Like in example 1, a cap layer 61 including a Ta layer having a thickness of about 5 nm is formed by a sputtering method between the laminated structure 50 and the connection part 62. Further, the configuration and structure of the laminated structure 50, the configuration and structure of the first wiring line 41, and the configuration of the interlayer insulating layer 30 are the same as those of example 1. Here, E0−EL≥1×1011 Pa is satisfied. The same is applicable to example 5 to example 11, which will be described later. Values of the Young's modulus EL of the low Young's modulus region 481 etc. are shown in the following table 3.

TABLE 3

| | Unit of Young's modulus: GPa | | | | |
|---|---|---|---|---|---|
| Example | First wiring line E1 | Recording layer E0 | Connection part 62 EC | Second wiring line E2 | Low Young's modulus region EH |
| 4 | Same as in example 1 | Same as in example 1 | Corresponding to low Young's modulus region E0 > EC = EL > E2 | 70 | 103 |
| 5 | Same as above | Same as above | 103 E0 > EL > E1 | Same as above | 116 |
| 6 | Same as above | Same as above | Corresponding to second low Young's modulus region Second low Young's modulus region: E0 > EC = EL > E2 First low Young's modulus region: E0 > EL > E1 | Same as above | First: same as in example 4 Second: same as in example 5 |
| 7 | Same as above | Same as above | Same as in example 5 E0 > EC > EL > E2 | Same as above | Same as in example 4 |
| 8 | Same as above | Same as above | Same as above E0 > EL > E1 | Same as above | Same as in example 5 |
| 9 | Same as above | Same as above | Same as above Second low Young's modulus region: E0 > EC = EL > E2 First low Young's modulus region: E0 > EL > E1 | Same as above | Same as in example 6 |
| 10 | Same as above | Same as above | Same as above Second low Young's modulus region: E0 > EC > E2 > EL First low Young's modulus region: E0 > E1 > EL | Same as above | First: 116 Second: 103 | laminated structure 50 has a magnetization reference layer 51, and internal stress occurs in the recording layer 53 and the magnetization reference layer 51 by providing the low Young's modulus region 481 and the perpendicular magnetic anisotropy of the recording layer 53 and the magnetization reference layer 51 is increased. Hence, the perpendicular magnetic anisotropy of the recording layer 53 is further increased and an axis of easy magnetization of the recording layer 53 can more reliably be oriented in a perpendicular direction.

In example 4, more specifically, the low Young's modulus region 481 is provided between the upper part of the The nonvolatile magnetic memory device of example 4 can be obtained by executing [Step-100] to [Step-130] of example 1, and further forming the second wiring line 42 on the interlayer insulating layer 30.

In the nonvolatile magnetic memory device of example 4, the low Young's modulus region 481 having the Young's modulus of the lower value than that of the Young's modulus of the material forming the recording layer 53 is provided above the laminated structure 50. Accordingly, internal stress occurs in the recording layer 53 and the perpendicular magnetic anisotropy of the recording layer 53 is increased.

As a result, the axis of easy magnetization of the recording layer 53 can more reliably be oriented in a perpendicular direction.

Example 5

Figure 6:
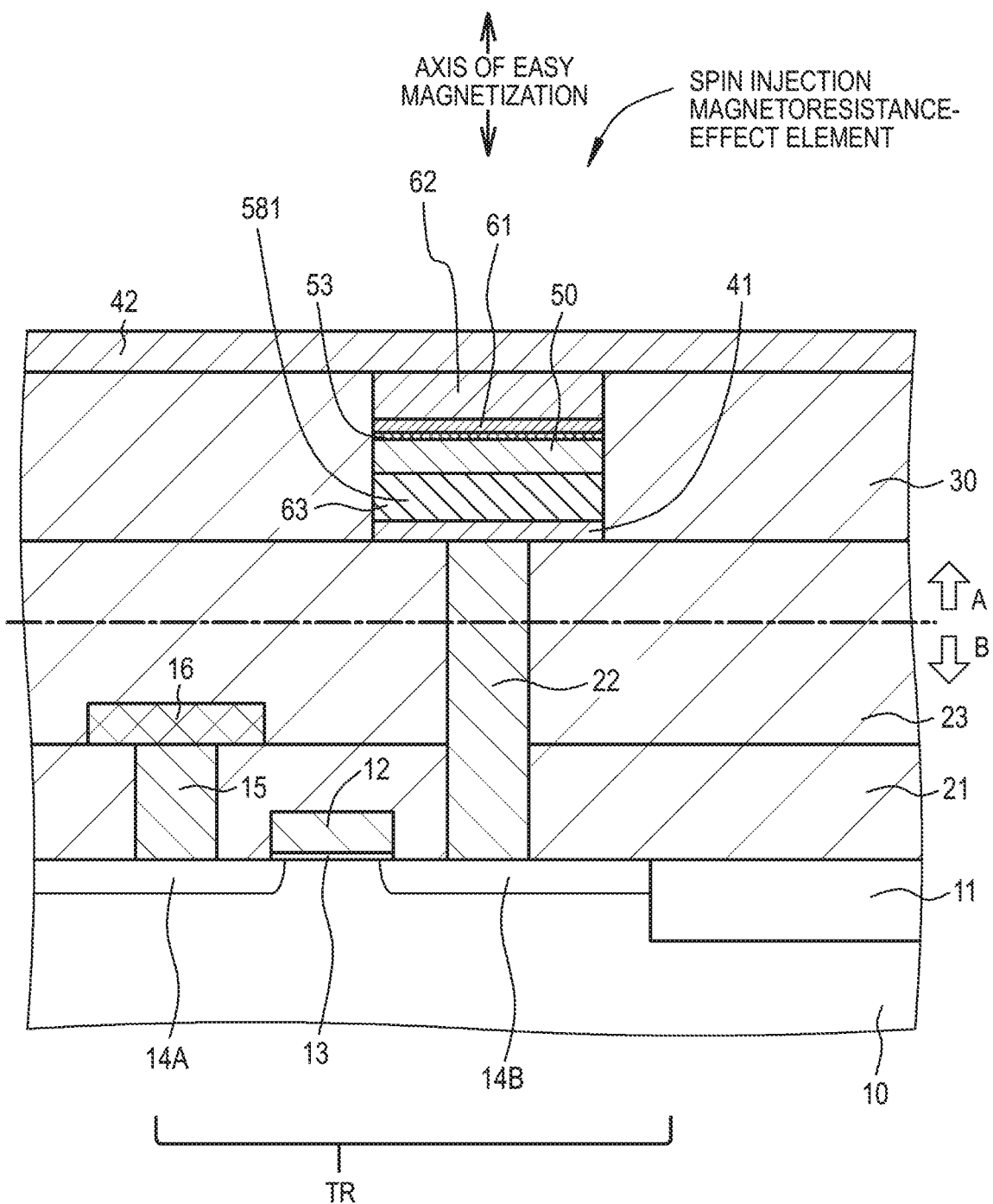
FIG. 6 is a schematic partial sectional view of a nonvolatile magnetic memory device of example 5.

Example 5 is a modification of example 4. FIG. 6 is a schematic partial sectional view of a nonvolatile magnetic memory device of example 5. In example 5, a low Young's modulus region 581 having a Young's modulus of a lower value than that of the Young's modulus of the material forming the recording layer 53 is provided below the laminated structure 50. Specifically, the low Young's modulus region 581 is provided between the lower part of the laminated structure 50 and the first wiring line 41. More specifically, a connection part 63 is provided between the lower part of the laminated structure 50 and the first wiring line 41, and the connection part 63 corresponds to the low Young's modulus region 581. Specifically, the disc-shaped connection part 63 (low Young's modulus region 581) includes niobium (Nb) having a thickness of 40 nm and is formed by a sputtering method. Note that, specifically, the connection part 62 includes titanium (Ti) having a thickness of 40 nm and is formed by a sputtering method. Values of the Young's modulus EL of the low Young's modulus region 581 etc. are shown in table 3. Except the above described points, the configuration and structure of the nonvolatile magnetic memory device of example 5 can be made the same as the configuration and structure of the nonvolatile magnetic memory device of example 4, and the detailed explanation will be omitted.

Example 6

Figure 7:
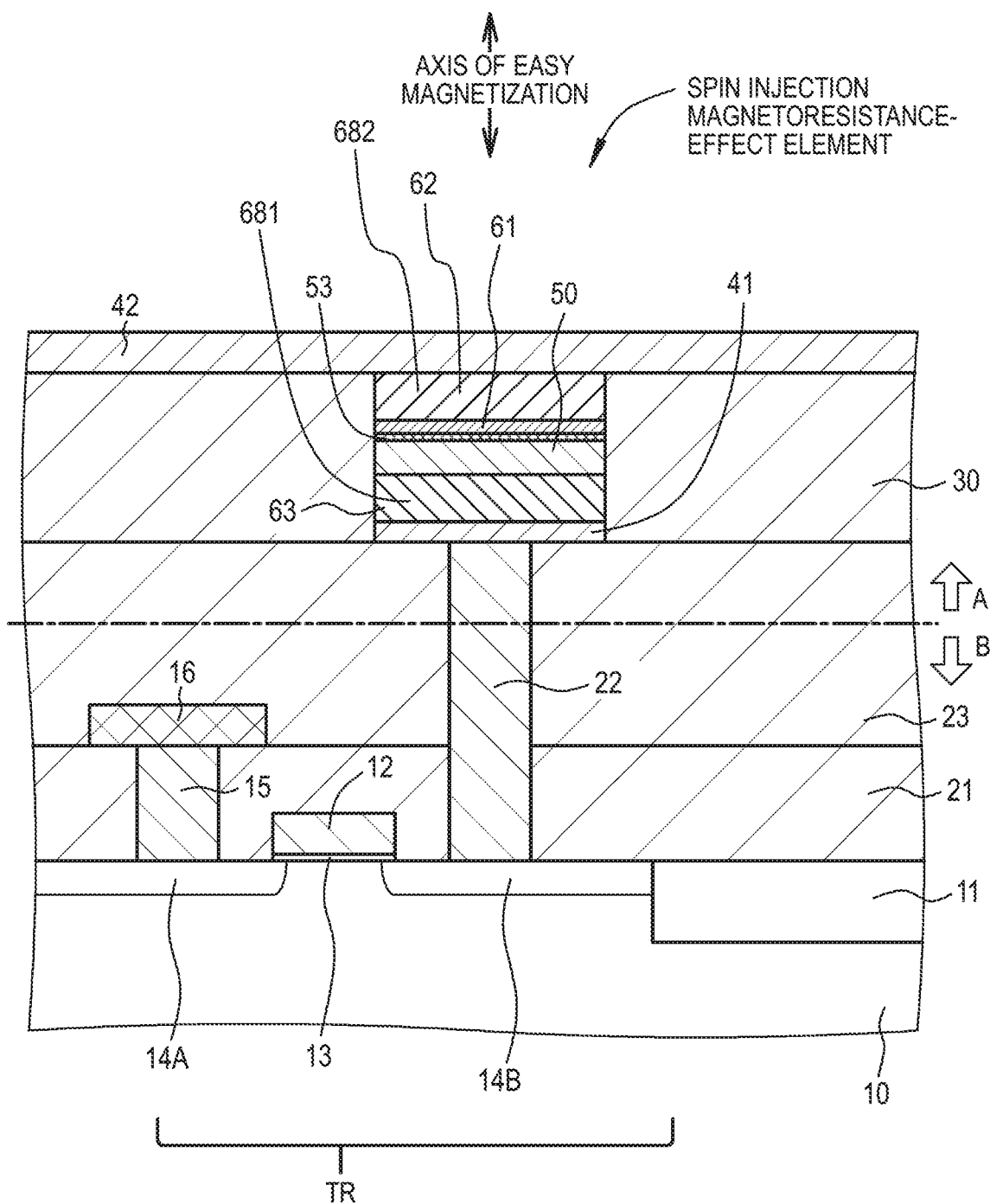
FIG. 7 is a schematic partial sectional view of a nonvolatile magnetic memory device of example 6.

Example 6 is a modification of example 4 and example 5. FIG. 7 is a schematic partial sectional view of a nonvolatile magnetic memory device of example 6. In example 6, a first low Young's modulus region 681 (connection part 63) having a Young's modulus of a lower value than that of the Young's modulus of the material forming the recording layer 53 is provided below the laminated structure 50. Further, a second low Young's modulus region 682 (connection part 62) having a Young's modulus of a lower value than that of the Young's modulus of the material forming the recording layer 53 is provided above the laminated structure 50. The configuration and structure of the first low Young's modulus region 681 and the configuration and structure of the first wiring line 41 can be made the same as those in example 5. Further, the configuration and structure of the second low Young's modulus region 682 and the configuration and structure of the second wiring line 42 can be made the same as those in example 4. Except the above described points, the configuration and structure of the nonvolatile magnetic memory device of example 6 can be made the same as the configurations and structures of the nonvolatile magnetic memory devices of example 4 and example 5, and the detailed explanation will be omitted.

Example 7

Figure 8:
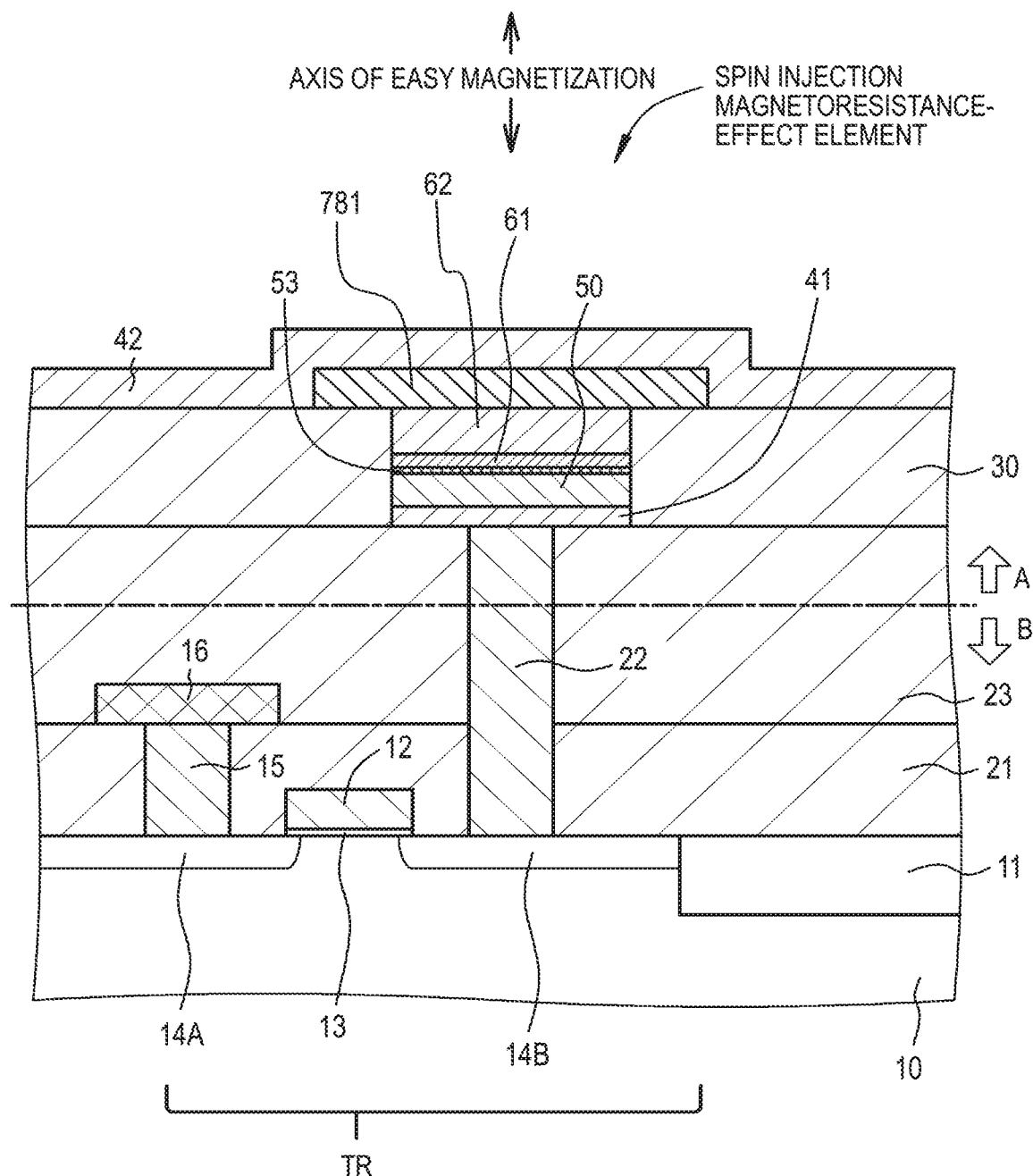
FIG. 8 is a schematic partial sectional view of a nonvolatile magnetic memory device of example 7.

Example 7 is also a modification of example 4. FIG. 8 is a schematic partial sectional view of a nonvolatile magnetic memory device of example 7. In example 7, the second wiring line 42 and a low Young's modulus region 781 have a laminated structure near the laminated structure 50. In example 7, specifically, the low Young's modulus region 781 includes the same material as that of the low Young's modulus region 481 of example 4. Further, the connection part 62 includes the same material as that of the connection part 62 of example 5. Except the above described points, the configuration and structure of the nonvolatile magnetic memory device of example 7 can be made the same as the configuration and structure of the nonvolatile magnetic memory device of example 4, and the detailed explanation will be omitted.

Example 8

Figure 9:
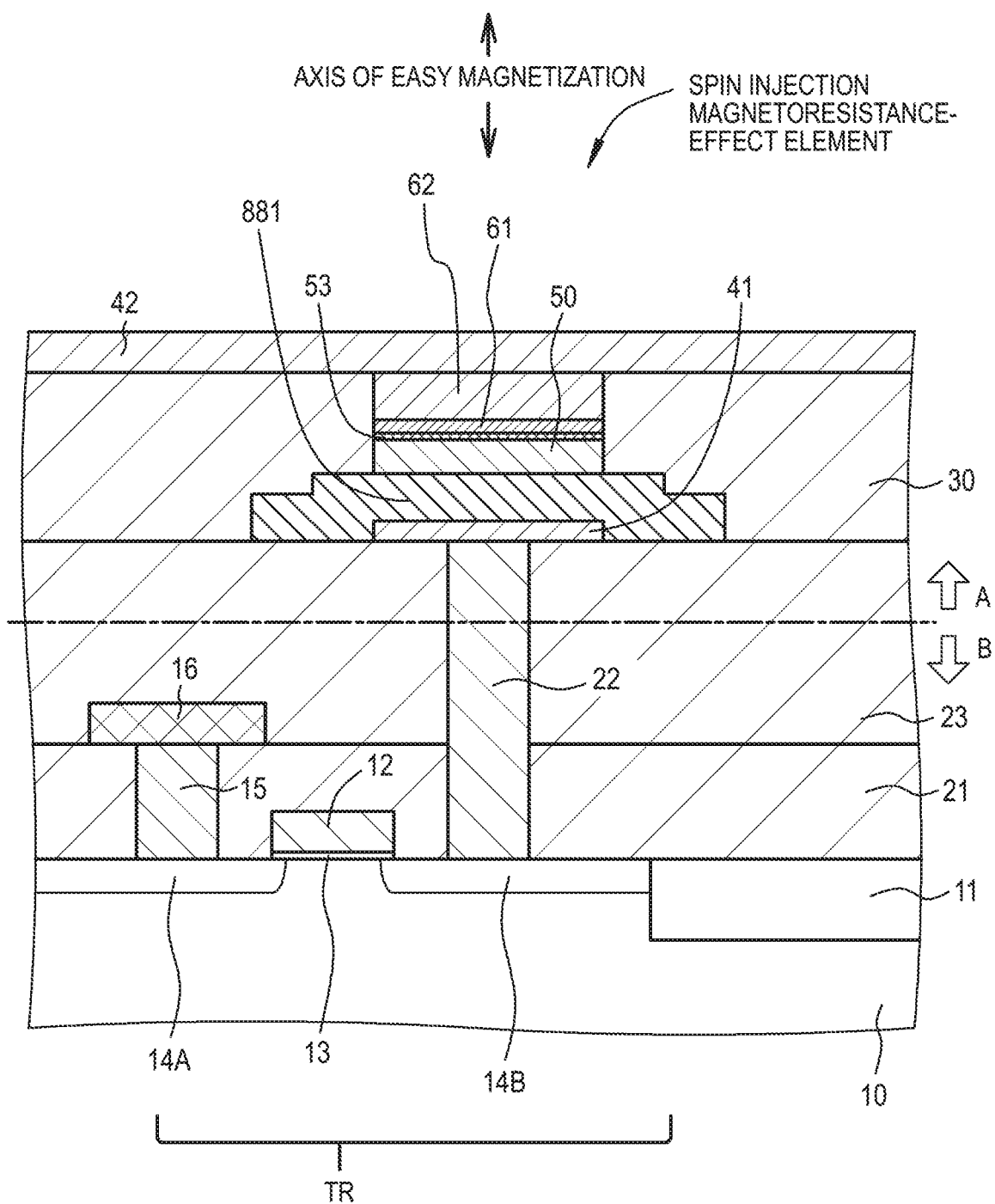
FIG. 9 is a schematic partial sectional view of a nonvolatile magnetic memory device of example 8.

Example 8 is a modification of example 5. FIG. 9 is a schematic partial sectional view of a nonvolatile magnetic memory device of example 8. In example 8, the first wiring line 41 and a low Young's modulus region 881 have a laminated structure near the laminated structure 50. In example 8, specifically, the low Young's modulus region 881 includes the same material as that of the low Young's modulus region 581 of example 5. Further, the connection part 62 includes the same material as that of the connection part 62 of example 5. Except the above described points, the configuration and structure of the nonvolatile magnetic memory device of example 8 can be made the same as the configuration and structure of the nonvolatile magnetic memory device of example 5, and the detailed explanation will be omitted.

Example 9

Figure 10:
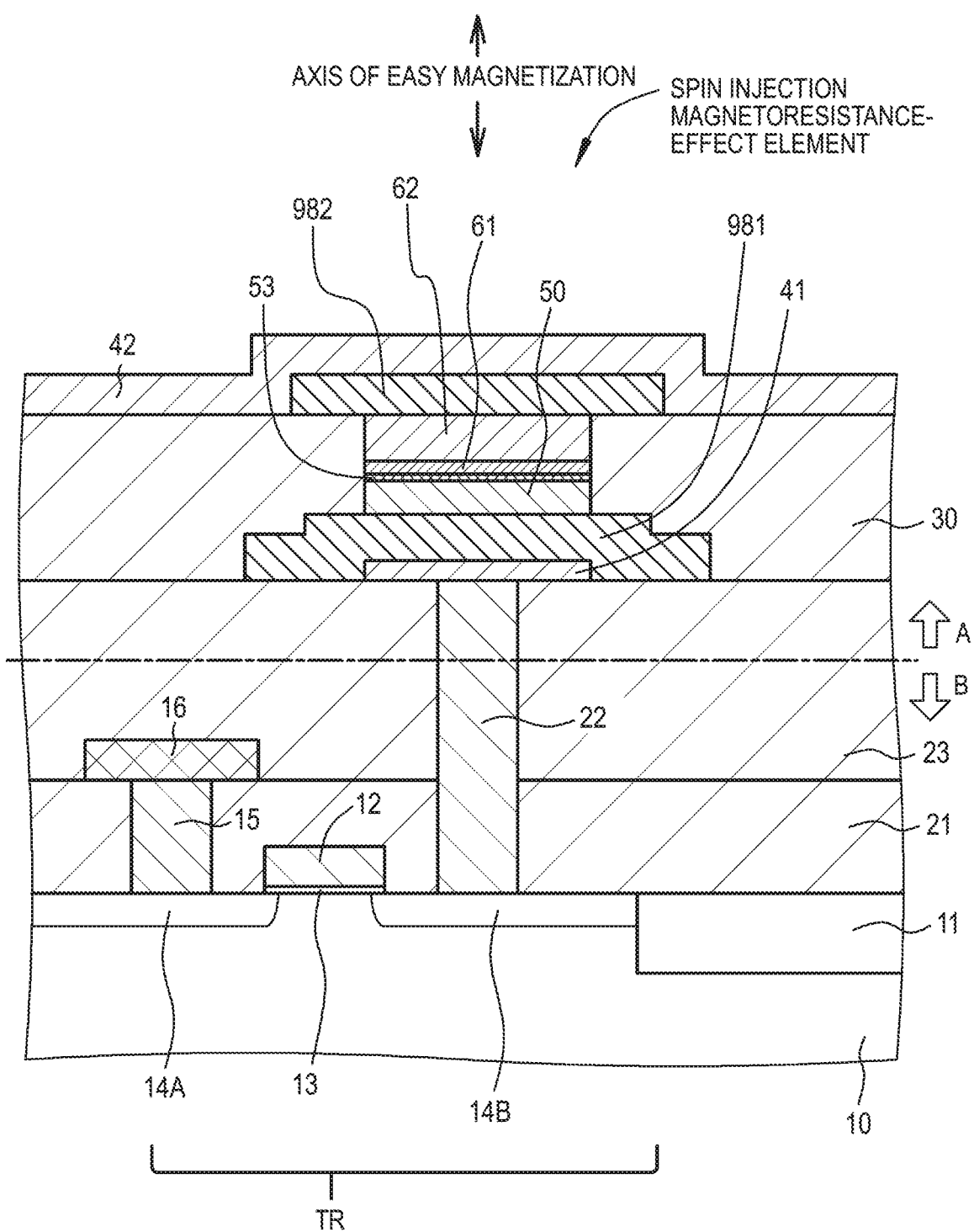
FIG. 10 is a schematic partial sectional view of a nonvolatile magnetic memory device of example 9.

Example 9 is a modification of example 6. FIG. 10 is a schematic partial sectional view of a nonvolatile magnetic memory device of example 9. In example 9, the first wiring line 41 and a first low Young's modulus region 981 have a laminated structure near the laminated structure 50. Further the second wiring line 42 and a second low Young's modulus region 982 have a laminated structure. The configuration and structure of the first low Young's modulus region 981 and the configuration and structure of the first wiring line 41 are the same as those of example 8. Further, the configuration and structure of the second low Young's modulus region 982 and the configuration and structure of the second wiring line 42 are the same as those of example 7. Except the above described points, the configuration and structure of the of the nonvolatile magnetic memory device of example 9 can be made the same as the configuration and structure of the nonvolatile magnetic memory device of example 6, and the detailed explanation will be omitted.

Example 10

Figure 11:
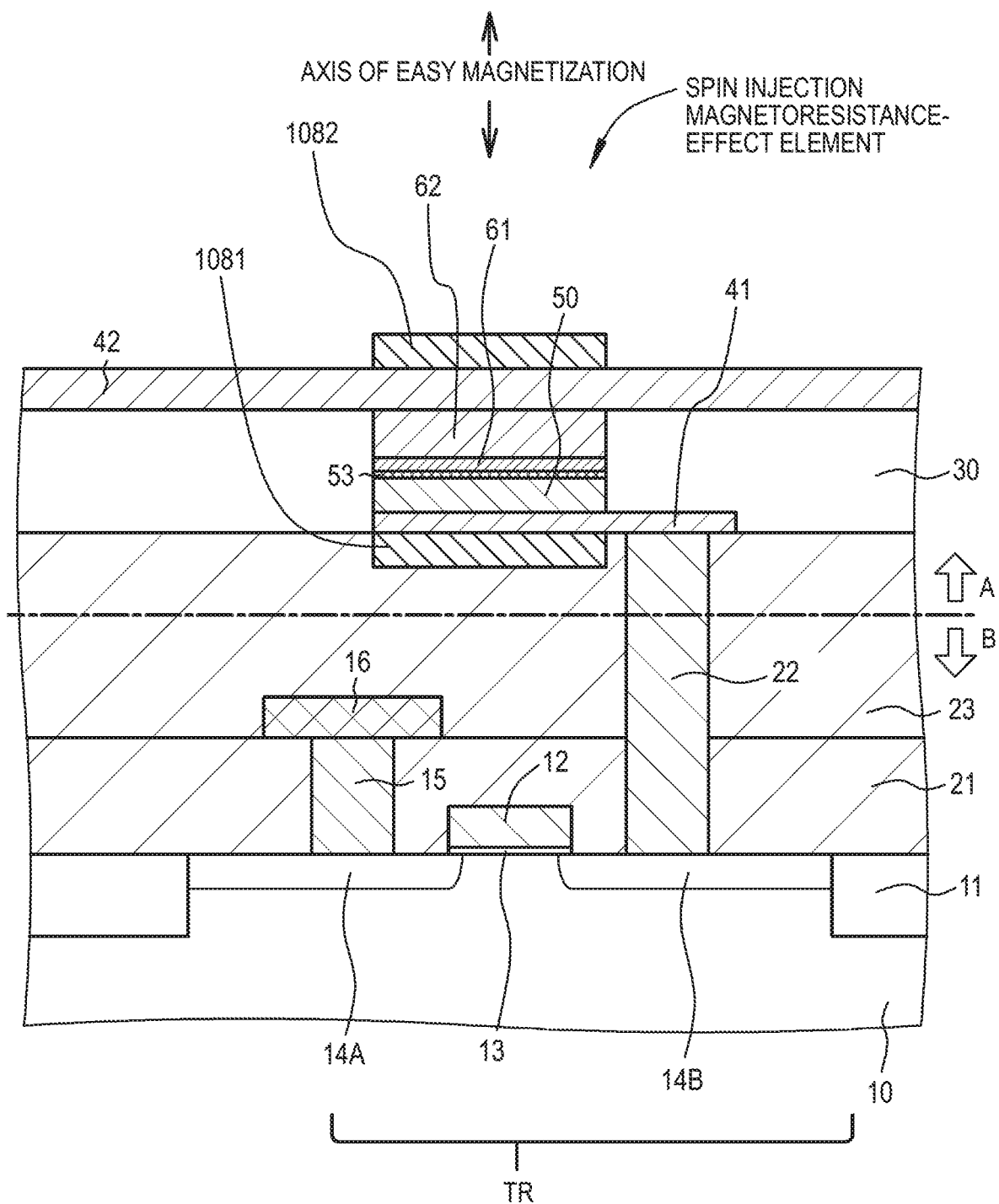
FIG. 11 is a schematic partial sectional view of a nonvolatile magnetic memory device of example 10.

Example 10 is a modification of example 4. FIG. 11 is a schematic partial sectional view of a nonvolatile magnetic memory device of example 10. In example 10, a first low Young's modulus region 1081 is provided below the lower part of the laminated structure 50 with the first wiring line 41 in between, and a second low Young's modulus region 1082 is provided above the upper part of the laminated structure 50 with the second wiring line 42 in between.

In example 10, specifically, the first low Young's modulus region 1081 includes titanium (Ti) having a thickness of 40 nm and is formed by a sputtering method. On the other hand, the second low Young's modulus region 1082 includes niobium (Nb) having a thickness of 40 nm and is formed by a sputtering method. Values of the Young's moduli EL of the low Young's modulus regions 1081, 1082 etc. are shown in table 3. Except the above described points, the configuration and structure of the nonvolatile magnetic memory device of example 10 can be made the same as the configuration and structure of the nonvolatile magnetic memory device of example 4, and the detailed explanation will be omitted. Note that, in example 10, the first low Young's modulus region 1081 and the second low Young's modulus region 1082 may be formed from a material having an inverse piezoelectric effect that the material deforms when an electric field is applied.

Example 11

Figure 12:
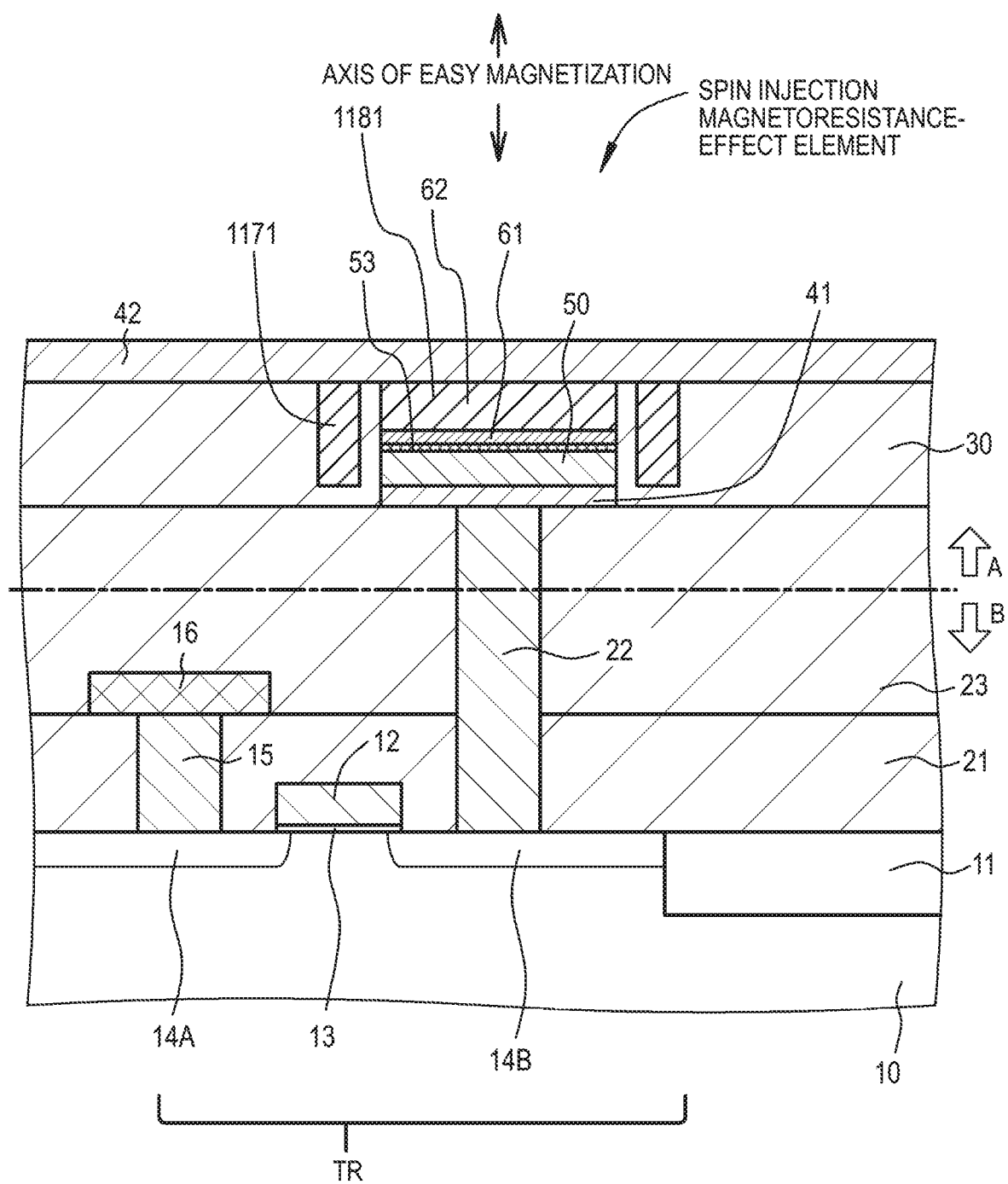
FIG. 12 is a schematic partial sectional view of a nonvolatile magnetic memory device of example 11.

Example 11 is also a modification of example 4, and relates to a nonvolatile magnetic memory device having a 2A-configuration and, more specifically, relates to a combination of example 4 and example 3. FIG. 12 is a schematic partial sectional view of a nonvolatile magnetic memory device of example 11. In example 11, in addition to a low Young's modulus region 1181 (having the same configuration and structure as those of the low Young's modulus region 481 of example 4), a high Young's modulus region 1171 (having the same configuration and structure as those of the high Young's modulus region 371 of example 3) is provided. That is, the high Young's modulus region 1171 having a Young's modulus of a higher value than that of the Young's modulus of the material forming the recording layer 53 is further provided close to the side surface of the laminated structure 50. Except the above described points, the configuration and structure of the nonvolatile magnetic memory device of example 11 can be made the same as the configurations and structures of the nonvolatile magnetic memory devices of example 4 and example 3, and the detailed explanation will be omitted.

Note that the configuration and structure of the nonvolatile magnetic memory device described in example 1 may be combined with the configurations and structures of the nonvolatile magnetic memory devices described in example 4 to example 10. Further, the configuration and structure of the nonvolatile magnetic memory device described in example 2 may be combined with the configurations and structures of the nonvolatile magnetic memory devices described in example 4 to example 10. Furthermore, the configuration and structure of the nonvolatile magnetic memory device described in example 3 may be combined with the configurations and structures of the nonvolatile magnetic memory devices described in example 5 to example 10.

As described above, the embodiments of the invention have been explained according to the preferred examples, however, the embodiments of the invention are not limited to the examples. Various laminated structures, the used materials, etc. are explained in the examples for illustrative purpose, and changes can be made appropriately. In the respective examples, the spin injection magnetoresistance-effect element having a structure in which the recording layer is located in the uppermost layer of the laminated structure has been explained, however, the order of lamination of the respective layers may be opposite and a spin injection magnetoresistance-effect element having a structure in which the recording layer is located in the lowermost layer may be used. Further, the magnetization reference layer 51, the nonmagnetic material film 52, and the recording layer 53 constituting the laminate structure may not formed in the same shape and size, but the magnetization reference layer 51 and the nonmagnetic material film 52 may be extended on the first wiring line 41. The arrangement condition of the connection hole 22 and the first wiring line 41 are also shown for illustrative purpose, and changes can be made appropriately. Furthermore, according to circumstances, the first wiring line and the second wiring line may have a configuration and a structure also serving as a low Young's modulus region. On the other hand, a high Young's modulus region may be formed from an insulating material.

A high-polarizability layer may be provided between the magnetization reference layer 51 and the nonmagnetic material film 52, or a high-polarizability layer may be provided between the recording layer 53 and the nonmagnetic material film 52. The high-polarizability layer includes a magnetic metal layer containing at least one kind of element selected from the group consisting of Fe, Co, and Ni, for example. The high-polarizability layer provided between the magnetization reference layer 51 and the nonmagnetic material film 52 is exchange-coupled to the magnetization reference layer 51. On the other hand, the high-polarizability layer provided between the recording layer 53 and the nonmagnetic material film 52 is exchange-coupled to the recording layer 53. By providing the high-polarizability layer in this manner, the magnetoresistance ratio can be increased. Since the high-polarizability layer typically provides in-plane magnetization in a single layer, in order not to lose the stability of perpendicular magnetization, it is necessary to adjust the magnetic thickness ratio between the magnetization reference layer 51 and the recording layer 53.

It should be understood by those skilled in the art that various modifications, combinations, sub-combinations and alterations may occur depending on design requirements and other factors insofar as they are within the scope of the appended claims or the equivalents thereof.

What is claimed is:

1. A nonvolatile magnetic memory device, comprising:
   a magnetoresistance-effect element that comprises:
      a laminated structure that comprises a recording layer, wherein an axis of easy magnetization of the recording layer is oriented in a direction perpendicular to the recording layer;
      a first region that has a first Young's modulus value, wherein
         the first Young's modulus value is different from a second Young's modulus value of a material of the recording layer, and
         the first region is above the laminated structure;
      a second region that extends along a side surface of the laminated structure, wherein the second region has a third Young's modulus value different from the first Young's modulus value; and
      an insulating layer between the second region and the side surface of the laminated structure.

2. The nonvolatile magnetic memory device according to claim 1, wherein the magnetoresistance-effect element further comprises:
   a first wiring line electrically connected to a first part of the laminated structure; and
   a second wiring line electrically connected to a second part of the laminated structure, wherein the first part is lower than the second part.

3. The nonvolatile magnetic memory device according to claim 2, wherein the first region is between the second part of the laminated structure and the second wiring line.

4. The nonvolatile magnetic memory device according to claim 2, wherein
the third Young's modulus value is higher than the second Young's modulus value, and
the second region extends from the second wiring line.

5. The nonvolatile magnetic memory device according to claim 1, wherein
the second region is within the insulating layer such that a periphery of the second region is surrounded by the insulating layer, and
a periphery of the recording layer is in contact with the insulating layer.

6. The nonvolatile magnetic memory device according to claim 1, wherein
the laminated structure further comprises a magnetization reference layer, and
the magnetization reference layer causes an internal stress between the recording layer and the magnetization reference layer.

7. The nonvolatile magnetic memory device according to claim 6, wherein the internal stress causes an increase in perpendicular magnetic anisotropy of the recording layer and perpendicular magnetic anisotropy of the magnetization reference layer.

8. The nonvolatile magnetic memory device according to claim 1, wherein the first region includes at least one of gold (Au), silver (Ag), zinc (Zn), copper (Cu), magnesium (Mg), aluminum (Al), or indium (In).

9. The nonvolatile magnetic memory device according to claim 1, wherein
the second region causes compression stress to the recording layer,
the third Young's modulus value is higher than the second Young's modulus value, and
perpendicular magnetic anisotropy of the recording layer is increased.

10. The nonvolatile magnetic memory device according to claim 1, wherein the second region comprises at least one of iridium (Ir), rhenium (Re), rhodium (Rh), ruthenium (Ru), molybdenum (Mo), tungsten (W), titanium nitride (Tin), titanium boride (TiB2), zirconium boride (ZrB2), zirconium nitride (ZrN), vanadium boride (VB2), niobium boride (NbB2), tantalum boride (TaB2), chromium boride (CrB2), molybdenum boride (Mo2B5), tungsten boride (W2B5), niobium carbide (NbC), tantalum carbide (TaC), or tungsten carbide (WC).

11. The nonvolatile magnetic memory device according to claim 1, wherein the magnetoresistance-effect element includes a spin injection magnetoresistance-effect element.

12. The nonvolatile magnetic memory device according to claim 1, wherein the material of the recording layer comprises at least one of a ferromagnetic material, an alloy including gadolinium, or an alloy including terbium.

13. The nonvolatile magnetic memory device according to claim 1, wherein the recording layer is configured to store information.

\* \* \* \* \*